United States Patent
Lin et al.

(10) Patent No.: US 11,209,398 B2
(45) Date of Patent: Dec. 28, 2021

(54) HIGH QUALITY FACTOR EMBEDDED RESONATOR WAFERS

(71) Applicant: APPLIED MATERIALS, INC., Santa Clara, CA (US)

(72) Inventors: Chuang-Chia Lin, San Ramon, CA (US); Surajit Kumar, San Jose, CA (US); Upendra Ummethala, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 162 days.

(21) Appl. No.: 16/597,615

(22) Filed: Oct. 9, 2019

(65) Prior Publication Data

US 2021/0080431 A1 Mar. 18, 2021

Related U.S. Application Data

(60) Provisional application No. 62/900,088, filed on Sep. 13, 2019.

(51) Int. Cl.
| | |
|---|---|
| *G01N 29/12* | (2006.01) |
| *H03H 9/02* | (2006.01) |
| *H01L 21/66* | (2006.01) |
| *H01L 21/67* | (2006.01) |

(52) U.S. Cl.
CPC ....... *G01N 29/12* (2013.01); *H01L 21/67253* (2013.01); *H01L 22/12* (2013.01); *H01L 22/34* (2013.01); *H03H 9/02566* (2013.01)

(58) Field of Classification Search
CPC ......... G01N 29/12; G01N 2291/02854; G01N 2291/2697; H03H 9/02566; H01L 22/12; H01L 22/34; H01L 21/67253
USPC .......................................................... 73/579
See application file for complete search history.

(56) References Cited

U.S. PATENT DOCUMENTS

| | | |
|---|---|---|
| 2004/0247008 A1 | 12/2004 | Scheuer et al. |
| 2006/0130585 A1 | 6/2006 | Magee et al. |
| 2010/0091370 A1* | 4/2010 | Mahrt .................. G02B 5/1876 359/574 |
| 2010/0156566 A1 | 6/2010 | Abdolvand et al. |
| 2014/0152152 A1 | 6/2014 | Burak et al. |
| 2019/0265288 A1* | 8/2019 | Lin .......................... H01L 22/12 |

OTHER PUBLICATIONS

International Search Report and Written Opinion from PCT/US2020/048554 dated Nov. 27, 2020, 15 pgs.

* cited by examiner

*Primary Examiner* — Tarun Sinha
(74) *Attorney, Agent, or Firm* — Schwabe, Williamson & Wyatt, P.C.

(57) ABSTRACT

Embodiments disclosed herein include diagnostic substrates and methods of using such substrates. In an embodiment, a diagnostic substrate comprises a substrate, and a device layer over the substrate. In an embodiment, the diagnostic substrate further comprises a resonator in the device layer. In an embodiment, the resonator comprises a cavity, a cover layer over the cavity, and electrodes within the cavity for driving and sensing resonance of the cover layer. In an embodiment, the diagnostic substrate further comprises a reflector surrounding a perimeter of the resonator.

16 Claims, 14 Drawing Sheets

HIGH QUALITY FACTOR EMBEDDED RESONATOR WAFERS

CROSS-REFERENCE TO RELATED APPLICATIONS

This application claims the benefit of U.S. Provisional Application No. 62/900,088, filed on Sep. 13, 2019, the entire contents of which are hereby incorporated by reference herein.

BACKGROUND

1) Field

Embodiments relate to the field of semiconductor manufacturing and, in particular, to systems and methods for monitoring processing parameters of semiconductor fabrication operations. In an embodiment, a resonator is surrounded by a reflector that is configured to reflect acoustic energy back to the resonator in order to provide improved quality factors.

2) Description of Related Art

The scale of critical dimension (CD) and other feature sizes in many semiconductor devices is continually shrinking. Extensive process development is needed in order to develop reliable processes with high repeatability. Typically, a process is developed by running the process on test substrates. The test substrates are then analyzed with various metrology tools in order to determine the results of the process. For example, cross-sections of the substrate may be analyzed to determine the amount of material removed with an etching process or material added with a deposition process.

The use of such test substrates and post processing metrology has several drawbacks. One drawback is that the cross-sectioning and analysis takes significant time (e.g., days or longer). Additionally, the cross-sectioning requires significant work for each location. As such, only a limited number of cross-sections can be analyzed for each process. Another drawback is that only the end result of the process is able to be analyzed. This limits the information that may be obtained about the process. For example, the rate of change of a process is not determinable from the end result of cross-sections of the test substrate.

SUMMARY

Embodiments disclosed herein include diagnostic substrates and methods of using such substrates. In an embodiment, a diagnostic substrate comprises a substrate, and a device layer over the substrate. In an embodiment, the diagnostic substrate further comprises a resonator in the device layer. In an embodiment, the resonator comprises a cavity, a cover layer over the cavity, and electrodes within the cavity for driving and sensing resonance of the cover layer. In an embodiment, the diagnostic substrate further comprises a reflector surrounding a perimeter of the resonator.

Additional embodiments include a diagnostic substrate that comprises a substrate, and a device layer over the substrate. In an embodiment, the device layer has a first impedance. In an embodiment, the diagnostic substrate further comprises a ring having a second impedance, where the ring surrounds at least a portion of the device layer. In an embodiment, the diagnostic substrate further comprises drivers and sensors configured to detect resonance.

Additional embodiments may include a method for determining a processing parameter. In an embodiment, the method comprises processing a diagnostic substrate, where the diagnostic substrate comprises a resonator and a reflector surrounding the resonator. The method may further comprise driving the resonator to a plurality of resonance modes, where acoustic waves propagating away from the resonator are reflected back towards the resonator by the reflector. In an embodiment, the method further comprises recording a resonant frequency of the resonator for each of the resonance modes. In an embodiment, the method further comprises determining the processing parameter from the resonant frequencies of the plurality of resonance modes.

DETAILED DESCRIPTION

Figure 1A:
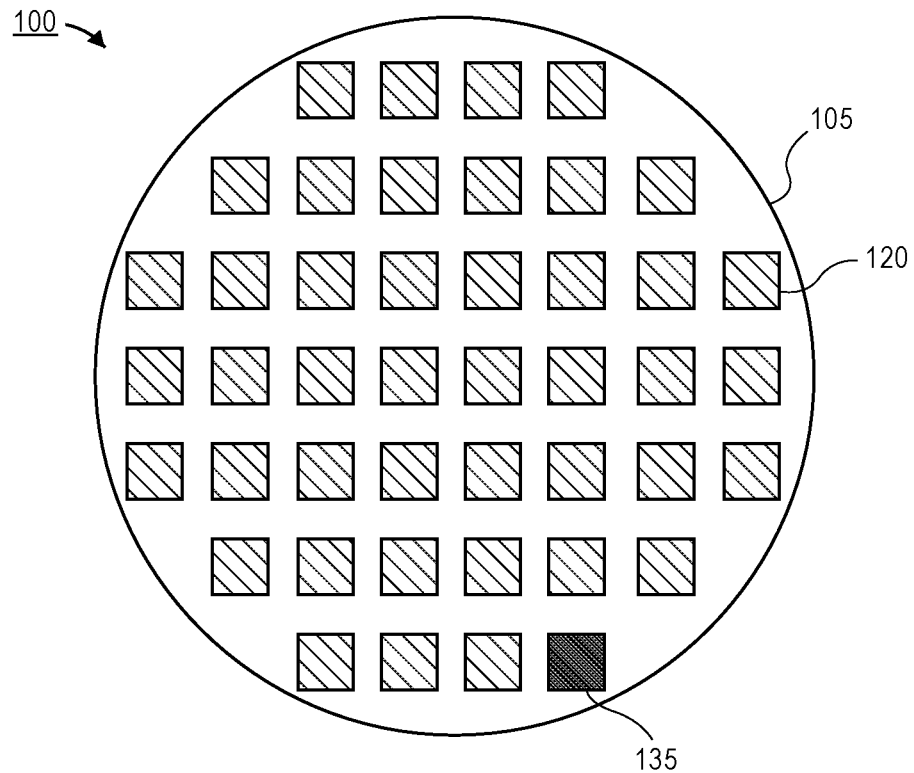
FIG. 1A is a schematic plan view of sensing regions on a substrate, in accordance with an embodiment.

Systems and methods described herein include diagnostic substrates for monitoring processing parameters of a processing operation. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the current timeline for developing a processing operation, such as an etching process, a deposition process, a polishing process, an implantation process, or the like, is long due to the labor intensive metrology needed to determine processing parameters. Embodiments described herein accelerate the process development by using diagnostic substrates. Diagnostic substrates described herein include a plurality of micro resonator sensors distributed across the substrate. Accordingly, process parameters and their degree of uniformity across the substrate surface may be obtained without requiring many cross-sections.

In some embodiments the plurality of micro resonator sensors may be grouped into sensing regions across the substrate surface. For example, hundreds of sensing regions, each including thousands or tens of thousands of micro resonator sensors, may be formed on the diagnostic substrate. In such embodiments, the micro resonators in each sensing region may be used to provide a high signal to noise ratio. Accordingly, embodiments allow for high resolution even when dealing with critical dimensions (CD) at the tens of nanometer scale. In some embodiments, changes in CD in the range of angstroms to several nanometers with an accuracy in the parts per million (PPM) may be detected.

In some embodiments, the micro resonator sensors may comprise a resonating body, such as a diaphragm that extends over a cavity. The diaphragms may be directly modified with the processing operation (e.g., deposition, etching, polishing, implantation or the like). Changes to the diaphragm result in changes to a resonant frequency of the diaphragm. The changes in the resonant frequency may then be used to determine the physical change to the surface of the diaphragm, to monitor conditions of the diaphragm, (e.g., temperature, surface potential, etc.) or to monitor external environmental conditions (e.g., pressure surrounding the diaphragm, etc.).

The accuracy provided by embodiments disclosed herein may be high, at least in part, due to the presence of one or more reflector rings around the resonating body. The reflector rings are configured to provide a barrier that reflects acoustic energy propagating away from the resonator back towards the resonator. Accordingly, the energy leakage from the resonator is significantly reduced and the quality factor is improved. For example, reflector rings such as those described herein may provide improvements in the quality factor of approximately 10× or more compared to a similar resonator without a reflector ring. High quality factors provide sharp peaks in resonant frequency, and therefore, provide improved resolution.

In an embodiment, the reflector rings may also be configured to be modulated in order to tailor the acoustic impedance to match a targeted wavelength in order to further improve the quality factor. For example, the reflector rings may have dimensions that can be changed with an actuator or the like. In other embodiments, the reflector rings may have material properties that are modulated (e.g., with a local heater). For example, heating a reflector ring may change the density and/or the modulus of the reflector ring in order to change the acoustic impedance. The use of some devices, such as actuators and heaters, may allow for real time in situ adjustments to the quality factor. In other embodiments, deposition of material over the reflector ring or subtraction of material from over the reflector ring may also be used to adjust the acoustic impedance to provide improved quality factors.

In some embodiments disclosed herein, the reflector ring itself may be used as the resonator. That is, the reflector ring may be a portion of the micro resonator that is monitored to provide a processing parameter. In such embodiments, acoustic energy is propagated inwards and is confined by the reflector ring in order to provide high quality factors. In some embodiments, a second reflector ring may encircle the first reflector ring in order to provide additional confinement of the acoustic energy.

Furthermore, embodiments may include diagnostic substrates that may be utilized to provide in-situ monitoring of the processing operation. In-situ monitoring allows for monitoring processing parameters during the processing operation. As such, the rate of change of a processing parameter may be determined as well. Embodiments may include a wireless module that transmits information from the diagnostic substrate in real time. Alternatively, the information from the micro resonator sensors may be stored in a memory on the diagnostic substrate and processed subsequent to the processing operation.

Referring now to FIG. 1A, a schematic plan view illustration of a diagnostic substrate 100 is shown, in accordance with an embodiment. In an embodiment, the diagnostic substrate 100 may be formed on a substrate 105. The substrate 105 may be any suitable substrate on which sensing regions 120 may be fabricated. For example, the substrate 105 may be a semiconductor substrate, such as silicon, a silicon on insulator (SOI), a glass substrate, or the like. In an embodiment, the substrate 105 may be considered a wafer (e.g., a 300 mm silicon wafer or the like). The substrate 105 may be substantially the same dimensions as a production substrate used to fabricate functioning devices using a processing operation being developed with the diagnostic substrate 100. Furthermore, the diagnostic substrate 100 may comprise a surface that matches that of device substrates. For example, the exposed surface (i.e., across the entire substrate including the sensing regions 120) may comprise a single crystalline silicon (or other semiconductor) material. Such a pristine surface allows for low surface roughness, suitable for providing measurements of CD at the angstrom to nanometer scales. Furthermore, since the surface of the diagnostic substrate 100 matches that of device substrates on which functioning semiconductor devices are fabricated, accurate comparison to typical semiconductor processing operations may be provided.

Additionally, while referred to as a diagnostic substrate, it is to be appreciated that embodiments may also include sensing regions 120 on device substrates. In such embodiments, the sensing regions 120 may be used during the fabrication of functioning devices in order to provide metrology or other quality control measures concurrent with the device fabrication.

According to an embodiment, the diagnostic substrate 100 may include a plurality of sensing regions 120. The sensing regions 120 may be distributed across the surface of the substrate 105. Including sensing regions 120 at different locations allows the uniformity of a processing operation to be determined. It is to be appreciated that the sensing regions 120 illustrated in FIG. 1A are exemplary in nature. The sensing regions 120 may be of any number and in any distribution over the surface of the substrate 105. In some embodiments, there may be more than one hundred sensing regions 120 distributed over the surface of the substrate 120.

Embodiments may also include one or more processing regions 135 on the diagnostic substrate 100. In an embodiment, the processing regions 135 may be communicatively coupled to the sensing regions (e.g., with conductive traces, vias or the like). In an embodiment, the processing regions 135 may include circuitry, logic modules, memory modules, signal processing modules, communication modules, or the like. The processing regions 135 may be used to drive electrodes (described in greater detail below) that will drive the resonance of resonating bodies in micro resonators in each sensing region 120. The processing regions 135 may record resonant frequencies of each micro resonator. The processing regions 135 may also determine a processing parameter from the resonant frequencies using methods described in greater detail below. In other embodiments, the determination of the processing parameters from the resonant frequencies may be implemented on a computing system external to the diagnostic substrate. For example, the raw (or processed) data from each micro resonator may be transmitted (e.g., with a wireless communication module) to an external device for further analysis. In an embodiment, the communication link may be implemented using RF (e.g., WiFi, Bluetooth, etc.), acoustic communications, inductive communication, or optical communication (e.g., fiber optics), or any other suitable communication protocol.

In some embodiments, the diagnostic substrate 100 may comprise only passive components. That is, the diagnostic substrate 100 may comprise micro resonators that are communicatively coupled to an external device with an antenna or the like. The micro resonators may be driven and sensed with the external device. For example, a wireless link for transmitting power and data between the external device and the micro resonators may be provided on the diagnostic substrate 100.

In the illustrated embodiment, the processing region 135 is illustrated as being formed on a top surface of the substrate 105. However, it is to be appreciated that the processing regions 135 may be embedded within the substrate 105 or formed on a backside surface of the substrate 105. In an embodiment, the processing region 135 may also include a power source. For example, the power source may be a battery, or the like. In other embodiments, the power source may be a wireless power source. For example, the power source may comprise conductive coils, antennas, or the like to enable inductive power coupling or an acoustic power coupling. In some embodiments, the wireless power source may also be configured to provide a data link. That is, frequencies of the micro resonators may be transmitted to an external device using wireless coupling (e.g., acoustic coupling, inductive coupling, etc.).

Figure 1B:
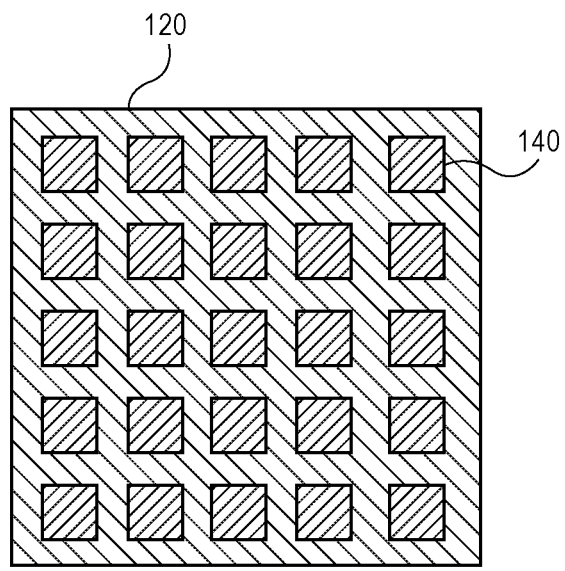
FIG. 1B is a zoomed in schematic plan view of a sensing region illustrating an array of micro resonator sensors, in accordance with an embodiment.

Referring now to FIG. 1B, a zoomed in schematic illustration of a sensing region 120 is shown, in accordance with an embodiment. Each sensing region 120 may include a plurality of micro resonator sensors 140. In the illustrated embodiment, twenty-five micro resonator sensors 140 are shown for simplicity. However, it is to be appreciated that thousands of micro resonator sensors 140 may be formed in each sensing region 120. For example, each of the micro resonator sensors 140 may have a surface area of approximately 50 $\mu m^2$. In such embodiments, forty thousand micro resonator sensors 140 may be formed in a sensing region of 100 $mm^2$. It is to be appreciated that the dimensions and number of micro resonator sensors 140 and the dimensions of the sensing regions 120 are exemplary in nature, and embodiments include micro resonators with dimensions greater than or less than 50 $\mu m^2$ and sensing regions with dimensions greater than or less than 100 $mm^2$. Furthermore, while each of the micro resonator sensors 140 are shown as being uniform, it is to be appreciated that micro resonator sensors 140 within the array may have different dimensions, configurations, or other different properties.

The large number of micro resonator sensors 140 in each sensing region 120 allows for high signal to noise ratios through noise reduction. As such, small changes to the processing parameter being investigated may be determined. For example, changes of angstroms to several nanometers in the CD of an etched structure may be discernable, in accordance with embodiments described herein. Embodiments described herein may include micro resonator sensors that have resonance frequencies of tens of MHz. In such resonators, trenches with a 1:1 trench:ridge ratio with a depth of 50 nm may induce a shift in the resonance frequency of approximately 0.05 to 5 MHz. Furthermore, a small changes (e.g., angstroms to nanometers) to the width of the trench may induce a resonance change of approximately 10 Hz to 1,000 Hz. Similarly, variations in temperature, surface potential, and/or pressure also drive resonance changes. For example, a single degree of temperature change may produce change in resonance frequency between 10 Hz and 1,000 Hz, or a change of one volt in surface potential may result in a change of resonance frequency between 10 Hz and 1,000 Hz. Such frequency variations are easily detectable with modern electronics and enable PPM accuracy.

Figure 2A:
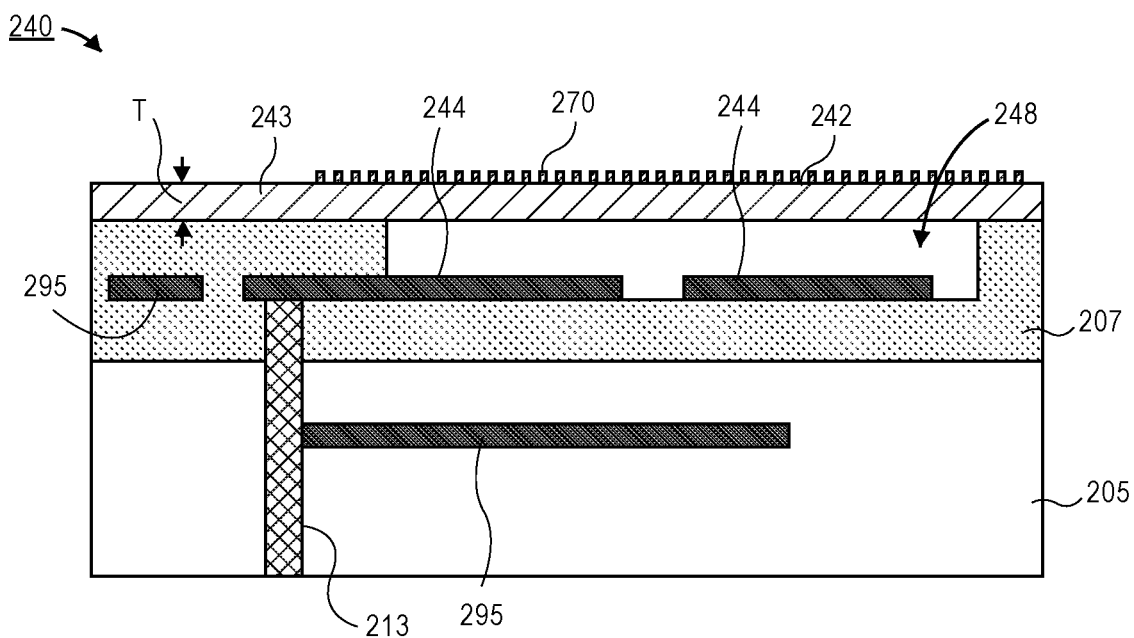
FIG. 2A is a cross-sectional illustration of a micro resonator sensor, in accordance with an embodiment.

Referring now to FIG. 2A, a cross-sectional illustration of a micro resonator sensor 240 is shown, in accordance with an embodiment. The micro resonator sensor 240 may be formed over and into a device layer 207 formed over the substrate 205. In an embodiment, the device layer 207 layer may comprise layers of insulating and conductive materials (e.g., traces, vias, etc.). While referred to herein as a "device layer" 207, it is to be appreciated that the device layer 207 may comprise only passive components in some embodiments. In other embodiments, the device layer 207 may include active components as well. In an embodiment, the micro resonator sensor 240 includes a capping layer 243 over the device layer 207. In some embodiments, the capping layer 243 may be a pristine semiconductor layer. For example, the capping layer 243 may be silicon. In an embodiment, the capping layer 243 may have a thickness T. For example, the thickness T may be between 1 micron and 100 microns. In an embodiment, the capping layer 243 may comprise a diaphragm 242 that extends over a cavity 248 formed into the device layer 207. That is, the diaphragm 242 may be considered to be part of the capping layer 243, and does not extend up from the capping layer 243. It is to be appreciated that the diaphragm 242 is one example of a micro resonator sensor 240. Embodiments include any resonator system. For example, the micro resonator 240 may include cantilevered beams, comb drives, or the like.

The diaphragm 242 may be driven to a resonant frequency by a plurality of electrodes 244 formed on a bottom surface of the cavity 248. In an embodiment, the plurality of electrodes 244 may be electrically coupled to the processing region 135 (not shown in FIG. 2) by electrical traces and vias 213. In an embodiment, a through substrate via 213 may be used to electrically couple the electrodes 244 to a backside surface of the substrate 205. In an embodiment, the electrodes 244 may be electrically coupled to the capping layer 242 with one or more vias 213, traces, or the like. In an embodiment, the plurality of electrodes 244 may be drive/sense electrodes. As such, the electrodes 244 may be used to drive the diaphragm 242 and to detect the resonance frequencies of the diaphragm 242 during the processing of the diaphragm 242. In an embodiment, the plurality of electrodes 244 may use capacitance to drive the diaphragm 242. However, it is to be appreciated that the resonance of the micro resonator 240 may be obtained with any suitable mechanism. For example, the micro resonator 240 may be driven with magnetic drive systems, thermal systems, acoustic systems, optical systems, or the micro resonator 240 may include piezo electric materials that induce resonance.

In an embodiment, a patterning mask 270 may be formed over the diaphragm 242. The patterning mask 270 may be used to mask portions of the diaphragm 242 from a processing environment, such as an etching environment. During the processing operation that is being investigated with the diagnostic substrate 100, the pattern of the patterning mask 270 may be transferred into the diaphragm. As the diaphragm 242 is processed (e.g., etched), the resonance frequencies of the diaphragm 242 will change in predictable ways. The changes in resonance frequencies may then be used to calculate the physical changes in the diaphragm 242, as will be described in greater detail below.

In some embodiments, a passive coupling antenna 295 may be used to wirelessly drive and sense the resonance of the micro resonator sensor 240. For example, the antenna 295 may be formed in the device layer 207. The use of a passive coupling antenna 295 allows for the contactless communication of the resonance frequencies to an external device and/or for contactless power delivery. Additionally, in some embodiments no active devices are included in the diagnostic substrate 200 when a passive coupling antenna 295 is associated with each micro resonator sensor 240.

Figure 2B:
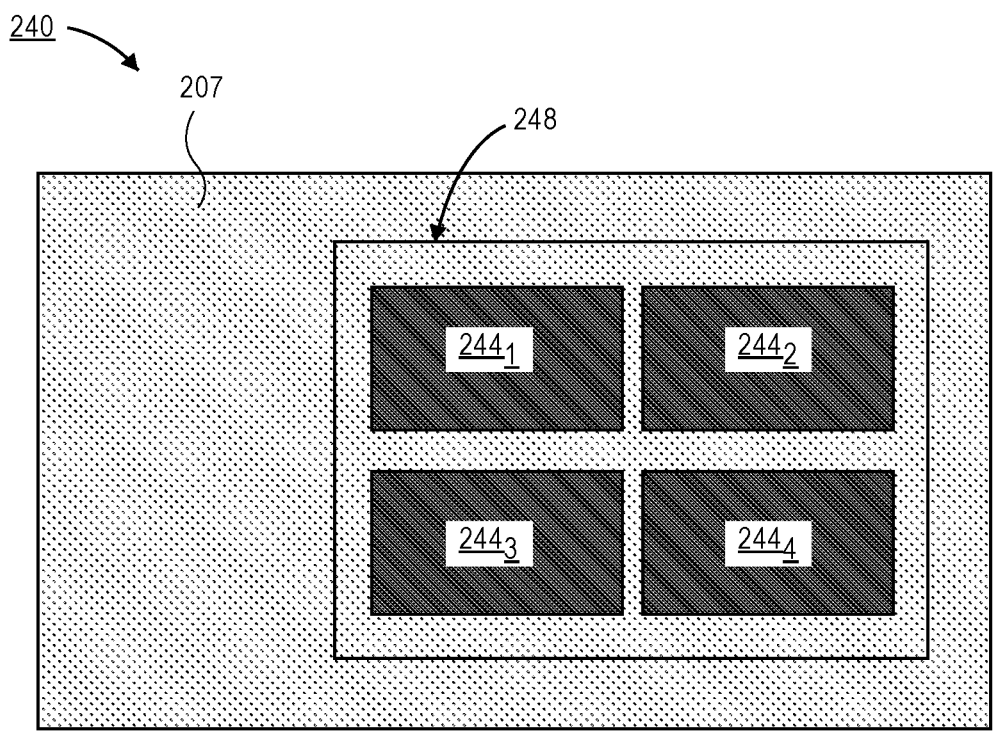
FIG. 2B is a plan view illustration of the micro resonator sensor, in accordance with an embodiment.

Referring now to FIG. 2B, a plan view illustration of the cavity 248 in the device layer 207 is shown, in accordance with an embodiment. In the illustrated embodiment, the cavity 248 includes a rectangular shape. However, embodiments are not limited to such configurations, and the cavity 248 may be any desired shape, such as a square, circular, elliptical, or any other desired shape. As shown, the plurality of electrodes 244 are formed in the cavity 248. In embodiments, the number and arrangement of the electrodes 244 allows for different resonance modes to be induced in the diaphragm 242. The diaphragm 242 is not shown in FIG. 2B in order to not obscure the underlying features.

In the illustrated embodiment, four electrodes are shown. When four electrodes are included in the cavity 248, the diaphragm may be driven to at least three different resonance modes. A first resonance mode may be obtained by activating all four electrodes $244_1$-$244_4$ in unison. A second resonance mode may be obtained by alternating the activation of electrodes $244_1$ and $244_2$ with the activation of electrodes $244_3$ and $244_4$. A third resonance mode may be obtained by alternating the activation of electrodes $244_1$ and $244_3$ with the activation of electrodes $244_2$ and $244_4$. It is to be appreciated that additional resonance modes may be obtained by activating different combinations of electrodes 244.

Figure 2C:
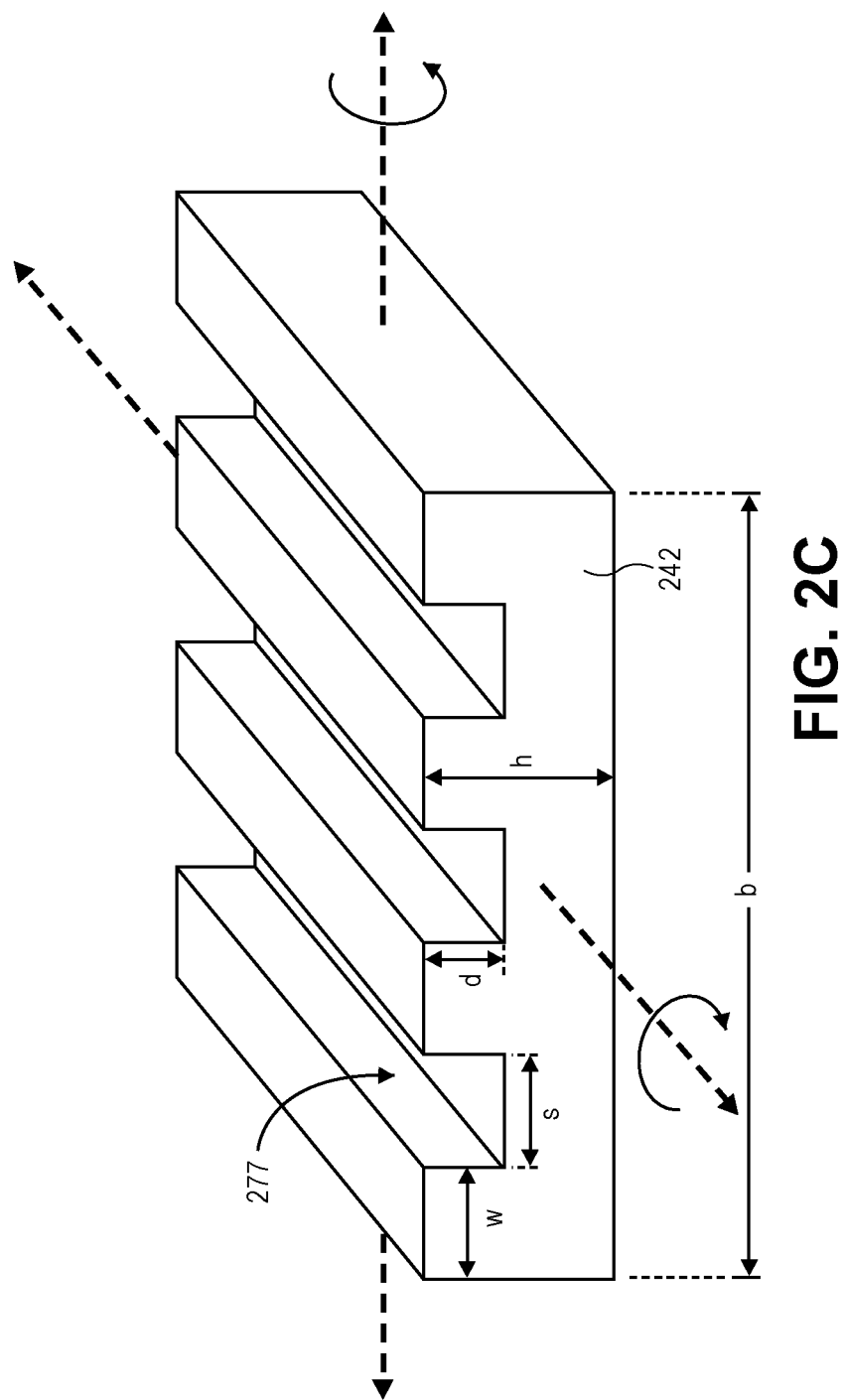
FIG. 2C is a perspective illustration of a pattern formed in the resonating body, in accordance with an embodiment.

Referring now to FIG. 2C, a perspective illustration of the diaphragm 242 is shown after being processed with a processing operation. The diaphragm 242 is shown in isolation in order to not obscure the figure. In an embodiment, the second resonant mode results in the diaphragm 242 bending about a line parallel to the direction of the trenches 277. In an embodiment, the third resonance mode results in the diaphragm 242 bending about a line perpendicular to the direction of the trenches 277. Initially, prior to etching the diaphragm that is substantially square, the resonant frequencies of the second and third resonance modes will be substantially uniform (since there are no trenches formed). After the trenches begin to be formed, the resonant frequencies of the second and third resonance modes begin to diverge. In a simplified lump model, the resonant frequency ω of the diaphragm is proportional to the moment of inertia I, as shown in Equation 1 where E is the modulus and m is the mass. Accordingly, as the moment of inertia I of each bending direction changes, so does the resonant frequency.

$$\omega \sim \sqrt{\frac{EI}{m}} \qquad \text{Equation 1}$$

The divergence of the resonant frequencies of the second and third resonance modes is the result of the moment of inertia about each bending direction changing in response to the changes in the topography of the diaphragm 242. Equations for calculating the moment of inertia about each bending direction can be modeled for expected topographies and even more accurate models may be numerically solved. For example, in a square diaphragm with a series of parallel trenches with a 1:1 trech:ridge ratio, the moment of inertia $I_{PARALLEL}$ is shown in Equation 2 and the moment of inertia $I_{PERPENDICULAR}$ is shown in Equation 3. It is to be appreciated that the equations disclosed herein are simplified lump models. Equations 1 and 2 do, however, illustrate magnitudes of various variables of the process. For example, the depth d in $I_{PERPENDICULAR}$ is cubed, whereas the d in the $I_{PARALLEL}$ is not raised to a higher power. Since the resonant frequencies for each mode are determined from the micro resonator sensor, the system of equations may then be solved to determine the missing parameters that provide the topography of the diaphragm 242.

$$I_{PARALLEL} = \frac{bh^3}{12} - \frac{bdh^2}{8} \qquad \text{Equation 2}$$

$$I_{PERPENDICULAR} = \frac{b(h-d)^3}{12} \qquad \text{Equation 3}$$

While the scenario of parallel trenches is provided above, it is to be appreciated that embodiments may include any patterned topography. In order to use a pattern, embodiments only require that a model of moments of inertia for a plurality of resonance modes be generated. For example, the modeled moments of inertia may include computer generated models that are far more complex than the examples provided in Equations 1-3. Furthermore, as the complexity of the model is increased, and the number of resonance modes increased, finer details of the topography of the diaphragm may be obtained. For example, the taper of a trench may be determined, the presence of undercuts or footings may be determined, or the like.

A key parameter to provide improved accuracy of the measurements is the quality factor of the micro resonator. Particularly, the quality factor of the micro resonators described with respect to FIGS. 2A and 2B is limited by acoustic energy loss. As the diaphragm 242 oscillates acoustic energy is propagated out away from the diaphragm 242. The acoustic energy propagates through the generation of acoustic waves that pass through the various layers of the device.

Figure 3A:
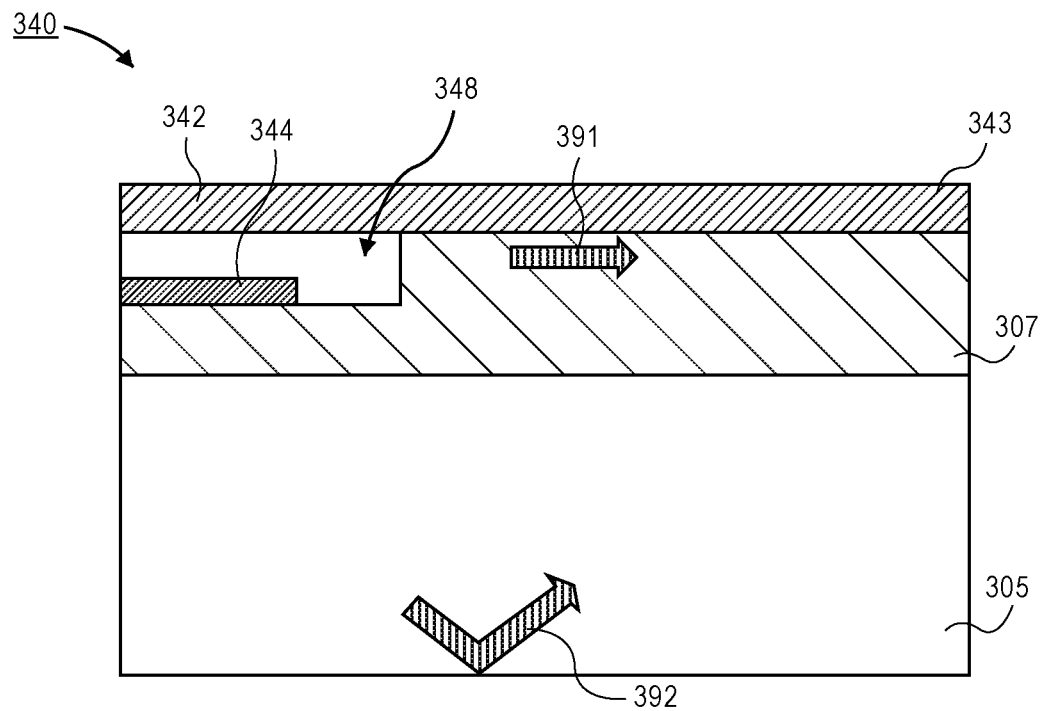
FIG. 3A is a cross-sectional schematic illustrating the propagation of surface waves and bulk waves away from the micro resonator sensor, in accordance with an embodiment.

Referring now to FIG. 3A a cross-sectional illustration of a portion of a micro resonator sensor 340 that schematically depicts the propagation of various types of acoustic waves 391, 392 is shown, in accordance with an embodiment. The micro resonator sensor 340 is similar to the micro resonator sensor in FIG. 2A, but simplified in order to not obscure certain aspects. For example, the micro resonator sensor 340 comprises a substrate 305, a device layer 307 and a capping layer 343. A diaphragm 342 is over a resonator cavity 348, and the diaphragm 342 is driven by an electrode 344.

Acoustic waves 391, 392 propagate away from the diaphragm 342 during oscillation of the diaphragm 342. Surface waves 391 may propagate along the surface. The surface wave 391 is shown as propagating in the device layer 307, but it is to be appreciated that the surface wave 391 may alternatively propagate near the capping layer 343, or propagate near both the capping layer 343 and the device layer 307, or propagate near the substrate 305, the device layer 307, and the capping layer 343, depending on material properties, dimensions, and the oscillation of the diaphragm 342. In an embodiment, bulk waves 392 may propagate in the substrate 305 as well as in the device layer 307. As shown, the bulk waves 392 reflect off interfaces with mismatched acoustic impedance (e.g., the bottom surface of the substrate 305 which interfaces with the external environment). While not illustrated in FIG. 3A, when the device layer 307 and the substrate 305 are different materials, some portion of the bulk waves 392 may also reflect at the interface between the device layer 307 and the substrate 305.

Figure 3B:
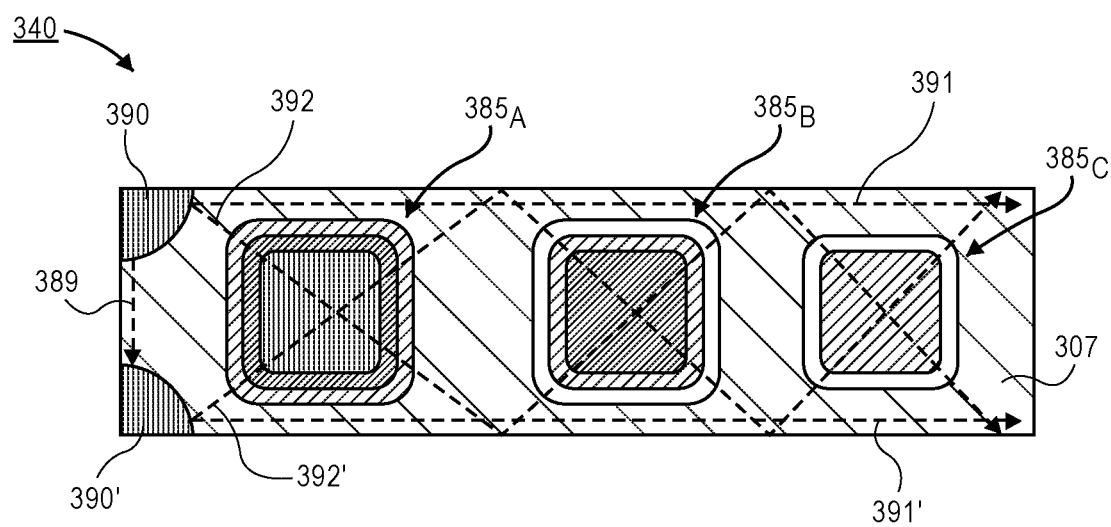
FIG. 3B is a cross-sectional schematic illustrating the acoustic energy propagating away from the micro resonator sensor, in accordance with an embodiment.

Referring now to FIG. 3B, an acoustic energy diagram that depicts the energy losses due to the propagation of acoustic waves 391 and 392 is shown, in accordance with an embodiment. In FIG. 3B, only the device layer 307 is shown for simplicity. However, similar diagrams may be exhibited when the capping layer 343 and the substrate 305 are included. As shown, a first source 390 of acoustic energy is provided at the top left corner of the diagram. The first source 390 represents the oscillating diaphragm 342. Surface waves 391 and bulk waves 392 may propagate away from the first source 390. A subset of the bulk waves 389 may propagate substantially downward and generate a second source 390' at the bottom left corner of the diagram. Secondary surface waves 391' and secondary bulk waves 392' may propagate away from the second source 390'.

As shown, the acoustic waves 391, 391', 392, and 392' may interact (i.e., with constructive and destructive interference) to form a repeating pattern of local energy peaks 385. Three peaks $385_{A-C}$ are shown with each successive peak having a lower intensity. Beyond the third peak $385_C$ the pattern would continue until a different boundary is reached (e.g., another micro resonator, an edge of the device, etc.). That is, the acoustic energy continues to dissipate as the waves 391, 391', 392, 392' propagate further away from the sources 390, 390'.

Accordingly, embodiments disclosed herein include micro resonator sensors that further comprise reflector rings. The reflector rings are acoustic barriers that reflect the acoustic energy (i.e., the surface waves and/or the bulk waves) back towards the diaphragm. Particularly, the reflector rings comprise an acoustic impedance that is different than the medium through which the waves are traveling (e.g., the capping layer, the device layer, and/or the substrate). In this way, more acoustic energy is preserved, and the quality factor of the micro resonator sensor is significantly improved.

Figure 4A:
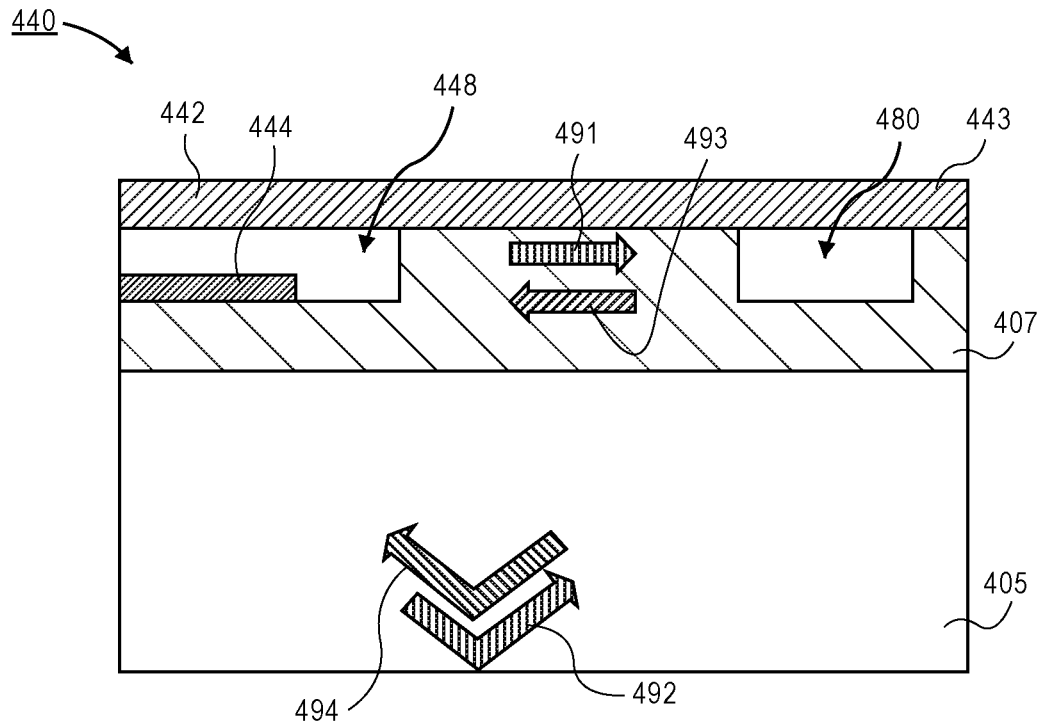
FIG. 4A is a cross-sectional schematic illustration the propagation of surface waves and bulk waves away from the micro resonator sensor and the reflected surface waves and bulk waves after reaching a reflector, in accordance with an embodiment.

Referring now to FIG. 4A, a cross-sectional schematic of a micro resonator sensor 440 with a reflector ring 480 is shown, in accordance with an embodiment. As shown, micro resonator sensor 440 includes a substrate 405, a device layer 407, and a capping layer 443. A resonator cavity 448 with a diaphragm 442 and an electrode 444 is also provided in the micro resonator sensor 440. In an embodiment, a reflector ring 480 is disposed around a perimeter of the resonator cavity 448. It is to be appreciated that only one side of the resonator sensor 440 is shown in FIG. 4A. For example, the missing side may be a mirror image of the side shown in FIG. 4A.

In an embodiment, the reflector ring 480 is a material that has a different acoustic impedance than the material surrounding the reflector ring 480. In the illustrated embodiment, the reflector ring 480 comprises a vacuum or air. That is, the reflector ring 480 is a cavity into the device layer 407. Due to the acoustic impedance mismatch between vacuum and the device layer 407, acoustic waves are reflected back towards the diaphragm 442. The efficiency of the reflection (i.e., the percentage of acoustic energy that is reflected) may be dependent on different factors. One factor is the difference between the acoustic impedances at the interface. Another factor is the matching of the geometry of the reflector ring 480 with the desired wavelengths begin reflected. For example, the reflector ring 480 may have dimensions that are large enough to interact with the acoustic waves. Additionally, the spacing of the reflector ring 480 may be chosen so that the reflection of the acoustic waves results in one or more standing waves being set up between the diaphragm 442 and the reflector ring 480. For example, the efficiency of the reflection may be approximately 80% or greater, approximately 90% or greater, or approximately 95% or greater. While the reflector ring 480 in FIG. 4A is shown as comprising a vacuum or air in a cavity, it is to be appreciated that other materials may be used as the reflector ring, and the reflector ring may be located in different positions, as will be described in greater detail below.

As shown schematically, the reflector ring 480 reflects the surface acoustic wave 491 to form a reflected surface acoustic wave 493 and reflects the bulk acoustic wave 492 to form a reflected bulk acoustic wave 494. The reflected acoustic waves 493 and 494 are directed back towards the diaphragm 442.

Figure 4B:
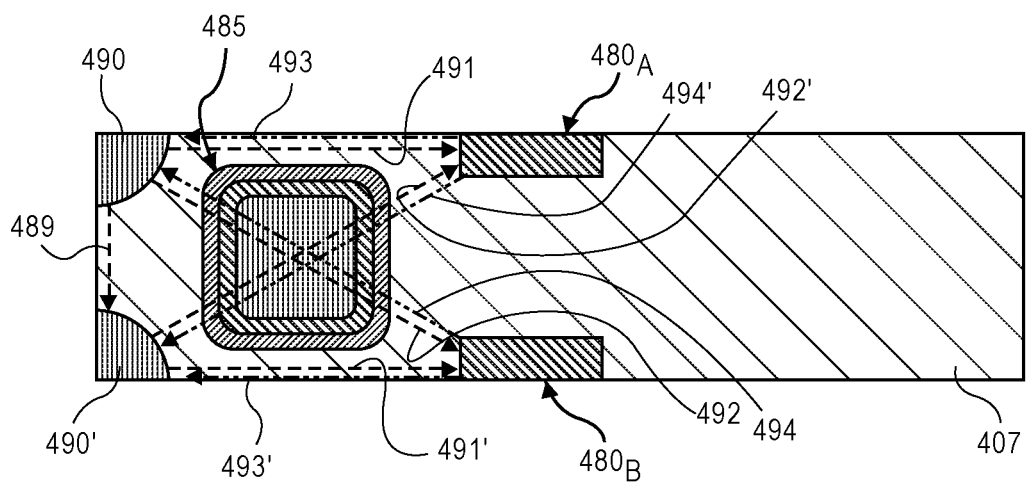
FIG. 4B is a cross-sectional schematic illustrating the acoustic energy being confined proximate to the micro resonator sensor by the reflectors, in accordance with an embodiment.

Referring now to FIG. 4B an acoustic energy diagram that depicts the reflection of acoustic waves 391 and 392 by a pair of reflector rings 480$_A$ and 480$_B$ is shown, in accordance with an embodiment. In FIG. 4B, only the device layer 407 is shown for simplicity. However, similar diagrams may be exhibited when the capping layer 443 and the substrate 405 are included. As shown, a first source 490 of acoustic energy is provided at the top left corner of the diagram. The first source 490 represents the oscillating diaphragm 442. While a diaphragm 442 is shown as the resonating body in FIG. 4A, it is to be appreciated that the first source 490 may represent any resonating body that may be used for the micro resonator sensor 440. Surface waves 491 and bulk waves 492 may propagate away from the first source 490. A subset of the bulk waves 489 may propagate substantially downward and generate a second source 490' at the bottom left corner of the diagram. Secondary surface waves 491' and secondary bulk waves 492' may propagate away from the second source 490'.

As shown, each of the acoustic waves 491, 491', 492, 492' are reflected by one of the reflector rings 480$_A$ and 480$_B$. Accordingly, a substantial portion of the acoustic energy is reflected back towards the diaphragm 442 and forms a standing wave. The reflection results in an acoustic energy peak 485 being isolated to the region between the source 490 and the reflector rings 480. This is a significant change compared to the acoustic energy diagram in FIG. 3B where the acoustic energy spreads and dissipates. Locally isolating the acoustic energy significantly improves the quality factor of the micro resonator sensor 440. For example, the quality factor may be increased by approximately 10× or more by including one or more reflector rings 480.

The micro resonator sensor in FIG. 4A represents one example of a micro resonator sensor 440 in accordance with embodiments disclosed herein. Additional micro resonator sensors with reflector rings having different positions, materials, and other configurations (and which will be described in greater detail below) may also function in substantially the same manner. That is, micro resonator sensors in accordance with some embodiments may reflect the acoustic energy back towards a resonating body in order to improve the quality factor of the micro resonator sensor.

Figure 5A:
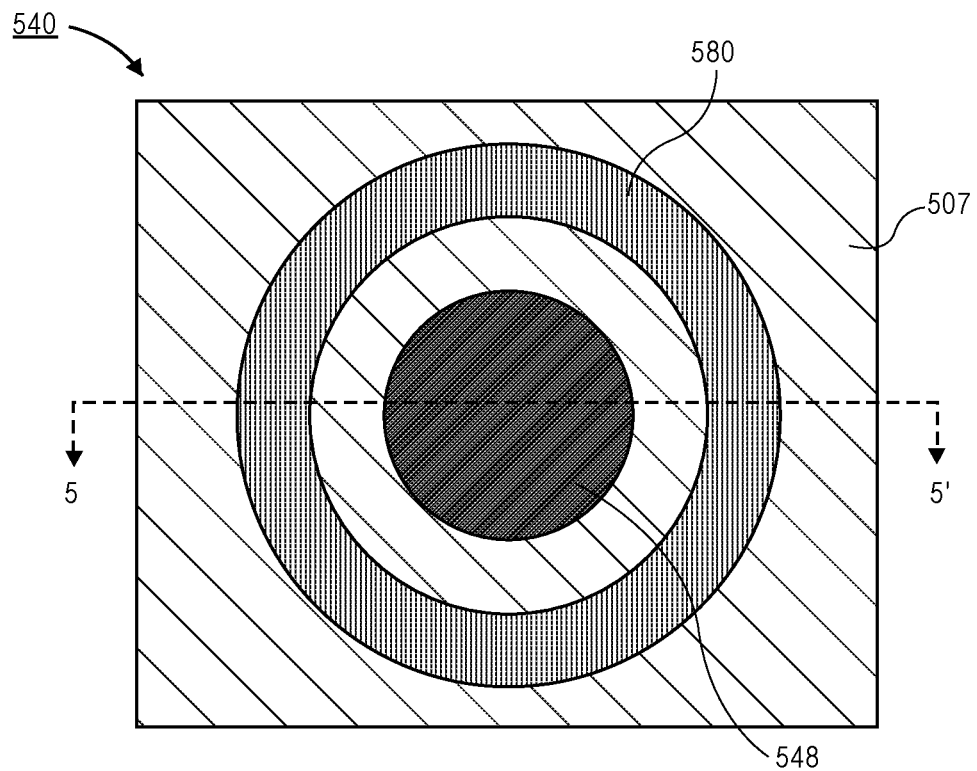
FIG. 5A is a plan view illustration of a micro resonator sensor with a resonating cavity and a reflector ring surrounding the resonating cavity, in accordance with an embodiment.

Referring now to FIG. 5A, a plan view illustration of a micro resonator sensor 540 is shown, in accordance with an embodiment. In the illustrated embodiment, the device layer 507 is shown without a capping layer in order to provide an unobstructed illustration of the resonator cavity 548 and the reflector ring 580.

In an embodiment, the resonator cavity 548 may be any suitable shape. A circular resonator cavity 548 is shown in FIG. 5A, but it is to be appreciated that the resonator cavity 548 may take any suitable shape. For example, the resonator cavity 548 may be rectangular, square, polygonal, elliptical, or any other desired shape. The resonator cavity 548 is shown as a different shading than the device layer 507 in order to indicate that the resonator cavity 548 extends down into the device layer 507.

In an embodiment, the reflector ring 580 surrounds a perimeter of the resonator cavity 548. In some embodiments, the shape of the reflector ring 580 matches the shape of the resonator cavity 548. For example, the circular resonator cavity 548 is surrounded by a circular reflector ring 580. In other embodiments, the shape of the resonator cavity 548 may not match the shape of the reflector ring 580. For example, the resonator cavity 548 may be circular and the reflector ring 580 may be a rectangular frame. In an embodiment, the shading of the reflector ring 580 is different than the shading of the device layer 507 in order to indicate that the reflector ring 580 is a different material than the device layer 507. For example, the reflector ring 580 may be a vacuum or air (i.e., a cavity into the device layer 507) or a different solid material that is embedded in the device layer 507 or positioned above and/or below the device layer 507.

Figure 5B:
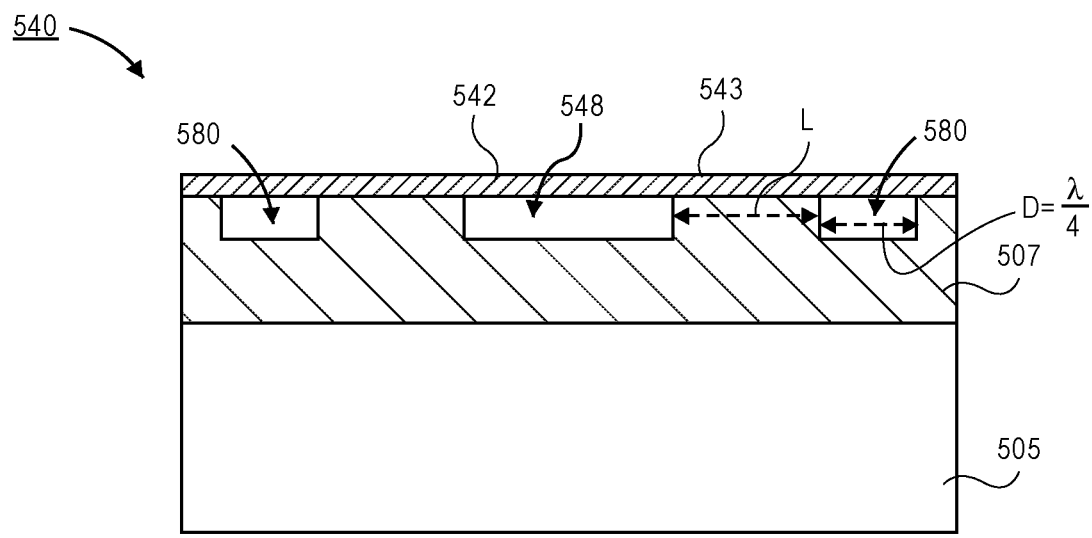
FIG. 5B is a cross-sectional illustration of the micro resonator sensor along line 5-5' in FIG. 5A where the reflector ring is a cavity in the device layer, in accordance with an embodiment.

Referring now to FIG. 5B, a cross-sectional illustration of the micro resonator sensor 540 in FIG. 5A along line 5-5' is shown, in accordance with an embodiment. In an embodiment, the micro resonator sensor 540 may comprise a substrate 505, a device layer 507 over the substrate 505, and a capping layer 543 over the device layer 507. In an embodiment, the micro resonator sensor 540 may comprise a resonator cavity 548 and a diaphragm 542 over the resonator cavity 548. However, it is to be appreciated that the micro resonator sensor 540 may comprise any suitable resonating body in the place of (or in addition to) the diaphragm 542.

In FIG. 5B, the reflector ring 580 comprises a vacuum or air. That is, a cavity is formed into the device layer 507. The cavity may be covered by a portion of the capping layer 543 in some embodiments. In an embodiment, the cavity of the reflector ring 580 may have a dimension D. The dimension D may be chosen to provide a desired reflection characteristic to the ring reflector 580. For example, the dimension D may be λ/4, where λ is the frequency of the acoustic energy that is desired to be reflected. Such cavities may sometimes be referred to as a "quarter-wave cavity". In an embodiment, the distance L between an edge of the resonator cavity 548 and an interior edge of the ring reflector 580 may be chosen to provide constructive interference when the reflected energy reaches the diaphragm 542. In the illustrated embodiment, the depth of the cavity of the reflector ring 580 may be substantially similar to the depth of the resonator cavity 548. For example, the bottom surface of the resonator cavity 548 may be substantially coplanar with a bottom surface of the reflector ring 580. However, other embodiments may include a resonator cavity 548 with a different depth than the cavity of the reflector ring 580.

Figure 5C:
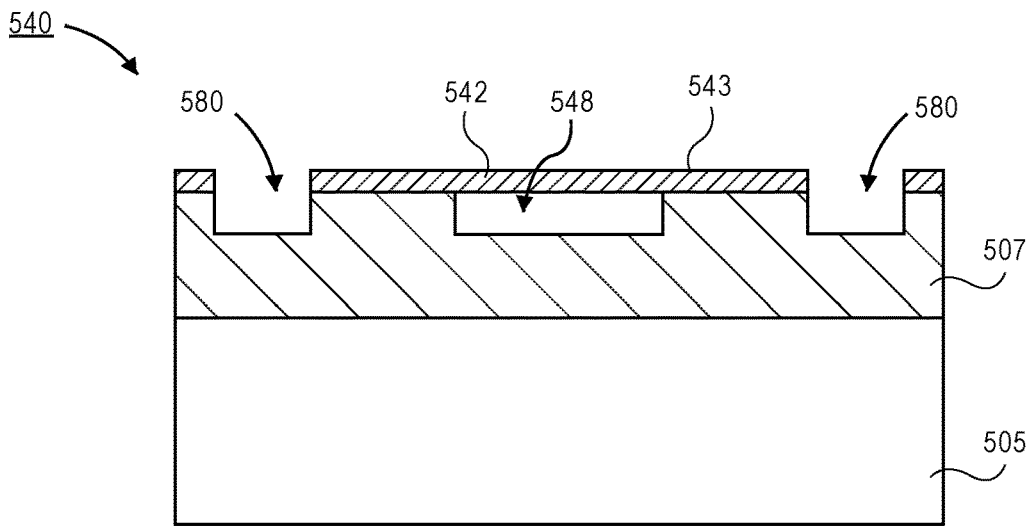
FIG. 5C is a cross-sectional illustration of the micro resonator sensor along line 5-5' in FIG. 5A where the reflector ring is a cavity that passes through the capping layer and into the device layer, in accordance with an embodiment.

Referring now to FIG. 5C, a cross-sectional illustration of the micro resonator sensor 540 in FIG. 5A along line 5-5' is shown, in accordance with an additional embodiment. The micro resonator sensor 540 in FIG. 5C may be substantially similar to the micro resonator sensor 540 in FIG. 5B, with the exception that the reflector ring 580 extends through the capping layer 543. Extending the reflector ring 580 through the capping layer 543 provides a reflective interface for acoustic waves that are propagated along the capping layer 543.

Figure 5D:
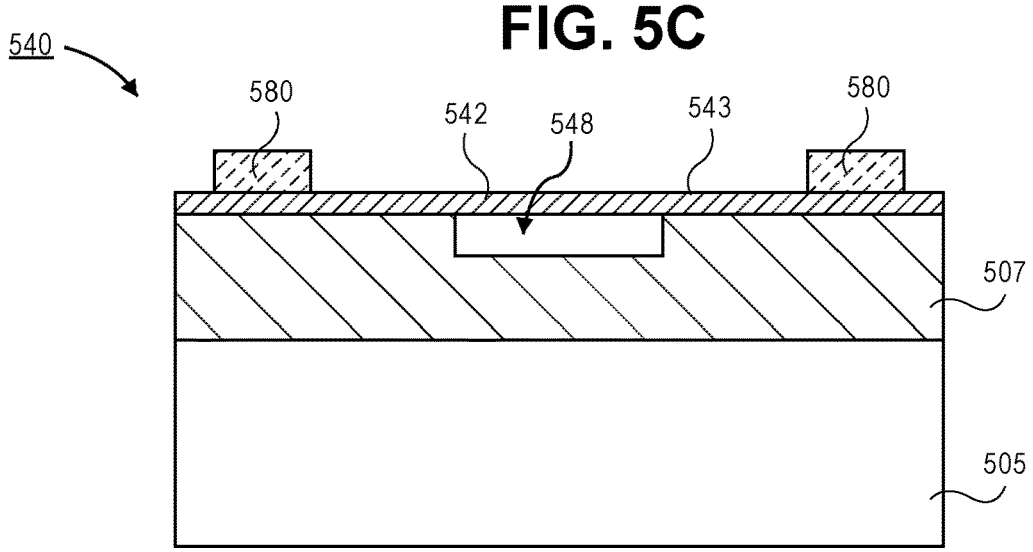
FIG. 5D is a cross-sectional illustration of the micro resonator sensor along line 5-5' in FIG. 5A where the reflector ring is a block above the capping layer, in accordance with an embodiment.

Referring now to FIG. 5D, a cross-sectional illustration of the micro resonator sensor 540 along line 5-5' in FIG. 5A is shown, in accordance with an additional embodiment. In an embodiment, the micro resonator sensor 540 may comprise a reflector ring 580 that is disposed above resonator cavity 548. In a particular embodiment, the reflector ring 580 is disposed above the top surface of the capping layer 543. In an embodiment, the reflector ring 580 may be a material block. The material of the material block may be a material that is different than the capping layer 543. Accordingly, an interface with mismatched acoustic impedances is provided in order to reflect surface acoustic waves back towards the diaphragm 542.

Figure 5E:
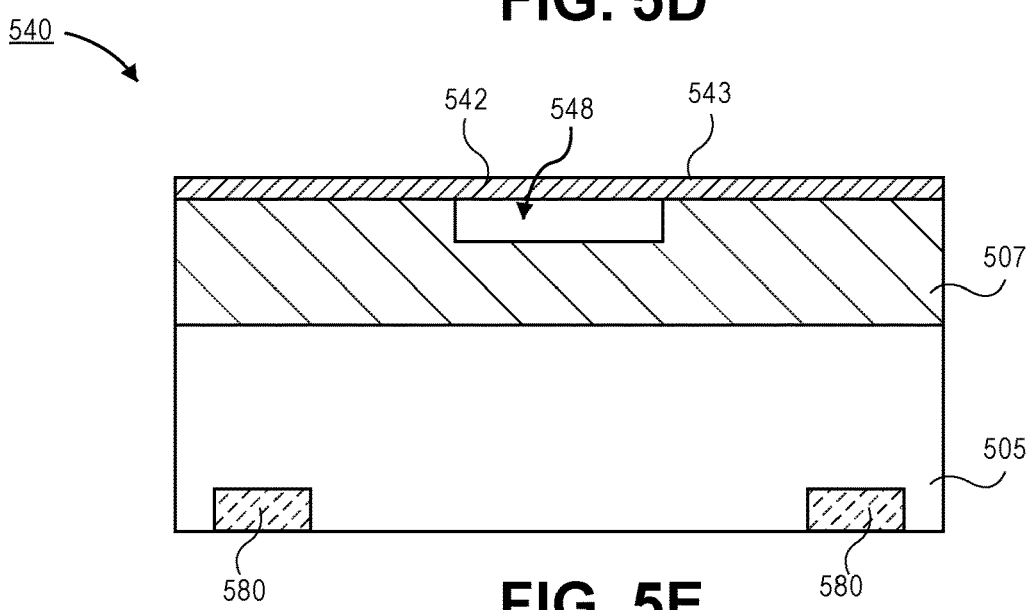
FIG. 5E is a cross-sectional illustration of the micro resonator sensor along line 5-5' in FIG. 5A where the reflector ring is a block embedded in the substrate, in accordance with an embodiment.

Referring now to FIG. 5E, a cross-sectional illustration of the micro resonator sensor 540 along line 5-5' in FIG. 5A is shown, in accordance with an additional embodiment. In an embodiment, the micro resonator sensor 540 may comprise a reflector ring 580 that is disposed below the resonator cavity 548. In a particular embodiment, the reflector ring 580 is disposed along the bottom surface of the substrate 505. The inclusion of a reflector ring 580 along the bottom surface of the substrate 505 may be particularly useful for reflecting surface acoustic waves that are propagated from a secondary acoustic source (e.g., similar to the second source 490' in FIG. 4B). A buried reflector ring 580 may also be beneficial for reflecting bulk waves that are propagated through the substrate 505.

Figure 5F:
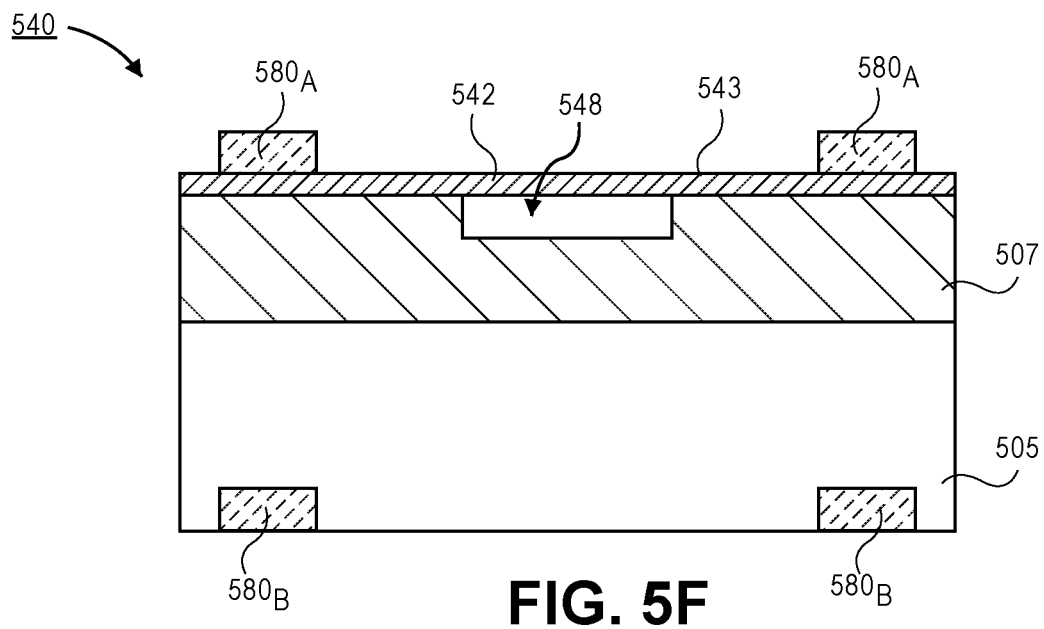
FIG. 5F is a cross-sectional illustration of the micro resonator sensor along line 5-5' in FIG. 5A where the reflector ring comprises a first ring above the resonator cavity and a second ring below the resonator cavity, in accordance with an embodiment.

Referring now to FIG. 5F, a cross-sectional illustration of the micro resonator sensor 540 along line 5-5' in FIG. 5A is shown, in accordance with an additional embodiment. In an embodiment, the micro resonator sensor 540 may comprise a plurality of reflector rings 580. For example, a first reflector ring 580A may be over a top surface of the capping layer 543, and a second reflector ring 580B may be at the bottom of the substrate 505. Accordingly, surface waves over the top surface and the bottom surface may be reflected.

Figure 5G:
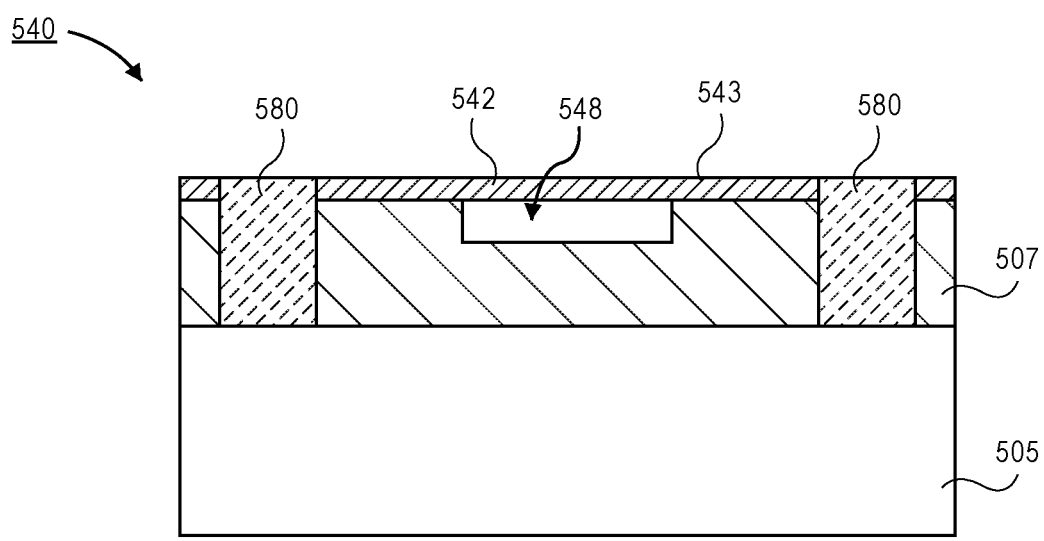
FIG. 5G is a cross-sectional illustration of the micro resonator sensor along line 5-5' in FIG. 5A where the reflector ring is a block embedded in the capping layer and the device layer, in accordance with an embodiment.

Referring now to FIG. 5G, a cross-sectional illustration of the micro resonator sensor 540 along line 5-5' in FIG. 5A is shown, in accordance with an additional embodiment. In an embodiment, the micro resonator sensor 540 may comprise a reflector ring 580 that is embedded in the device layer 507 and the capping layer 543. Extending the reflector ring 580 below the resonator cavity 548 allows for bulk acoustic waves to be reflected in addition to reflecting the surface acoustic waves. In an embodiment, the embedded reflector ring 580 is a solid material. In other embodiments, the embedded reflector ring 580 may comprise a vacuum or air. That is, the reflector ring 580 may comprise a cavity through both the capping layer 543 and the device layer 507. Furthermore, while the embedded reflector ring 580 extends to the interface between the device layer 507 and the substrate 505, in some embodiments, the embedded reflector ring 580 may also extend into (or entirely through) the substrate 505 as well.

Figure 6:
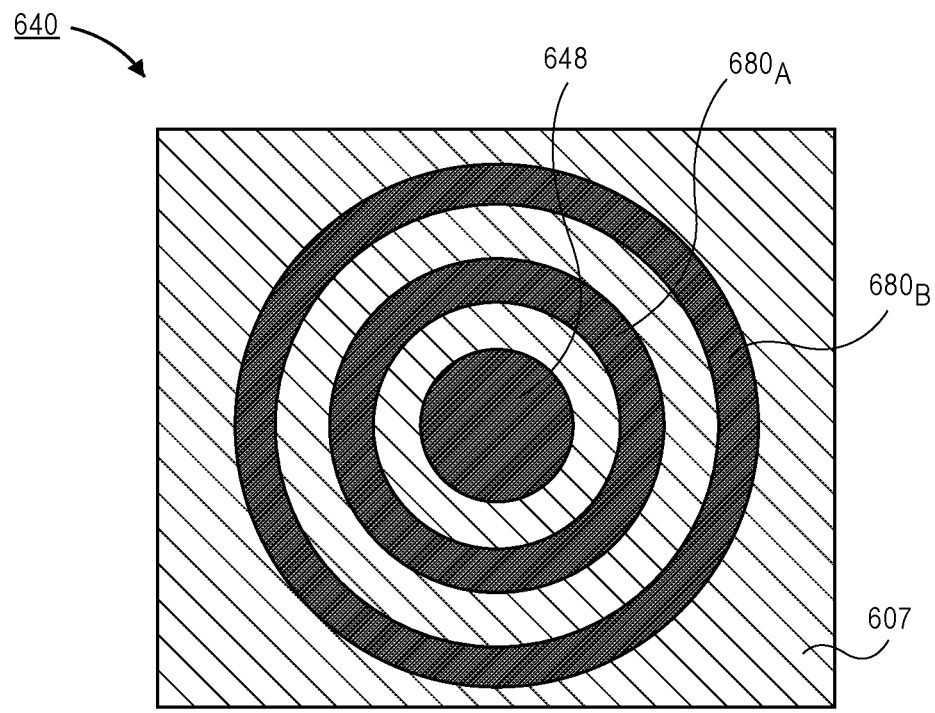
FIG. 6 is a plan view illustration of a micro resonator sensor with a first reflector ring and a second reflector ring around the resonator cavity, in accordance with an embodiment.

Referring now to FIG. 6, a plan view illustration of a micro resonator sensor 640 is shown, in accordance with an additional embodiment. The micro resonator sensor 640 in FIG. 6 may be substantially similar to the micro resonator sensor 540 in FIG. 5A, with the exception that a second reflector ring $680_B$ surrounds the first reflector ring $680_A$. In an embodiment, both the first reflector ring $680_A$ and the second reflector ring $680_B$ may surround a resonator cavity 648 in the device layer 607. The inclusion of additional reflector rings 680 provides improved efficiency and higher quality factors compared to a single reflector ring 680. While two reflector rings $680_A$ and $680_B$ are shown, it is to be appreciated that any number of reflector rings 680 may be used.

The quality factor of the micro resonator sensor is dependent, in part, on the efficiency of the reflection of the acoustic energy. The efficiency of the reflection depends on how well the reflector ring is tuned to reflect a given frequency. Since the resonant frequencies of the resonating body change as the capping layer of device is processed (e.g., etching, deposition, polishing, etc.), it is desirable to be able to tune the reflector ring. In some embodiments, the reflector ring may be tuned in real time during the processing of the capping layer. In other embodiments, the reflector ring may be tuned before or after processing of the capping layer.

Figure 7A:
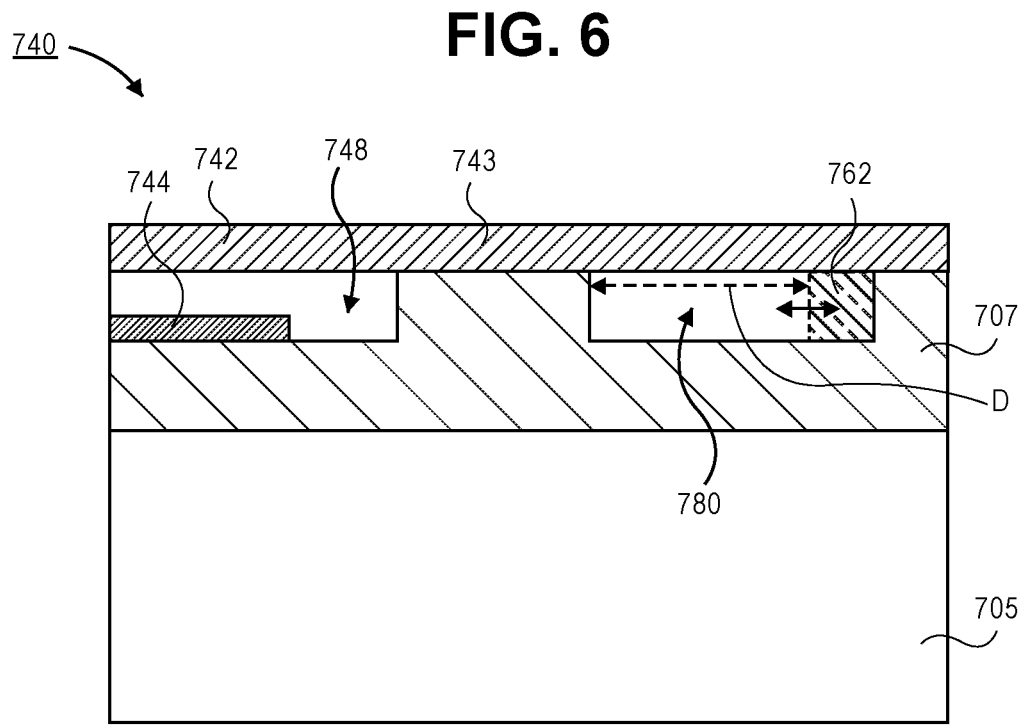
FIG. 7A is a cross-sectional illustration of a micro resonator sensor with a reflector ring with a dimension that is modulated by an actuator, in accordance with an embodiment.

Referring now to FIG. 7A, a cross-sectional illustration of a micro resonator sensor 740 with a tunable reflector ring 780 is shown, in accordance with an embodiment. In an embodiment, the micro resonator sensor 740 may comprise a substrate 705, a device layer 707, and a capping layer 743. A resonator cavity 748 with an electrode 744 and a diaphragm 742 are also included in the micro resonator sensor 740.

In an embodiment, the reflector ring 780 comprises a vacuum or air in a cavity into the device layer. As shown, the reflector ring 780 cavity includes a dimension D. In an embodiment, the dimension D is modulated by an actuator 762. For example, the actuator 762 may expand and contract (as indicated by the arrows) to change the dimension D of the reflector ring 780. In an embodiment, the actuator 762 is a piezoelectric or a piezothermal actuator. Other suitable types of actuators may be used to alter a dimension D of the reflector ring 780. Additionally, while the dimension D is shown as being the width of the reflector ring 780, the dimension D may also include a thickness. Embodiments may also include altering more than one dimension of the reflector ring 780 with one or more actuators.

Figure 7B:
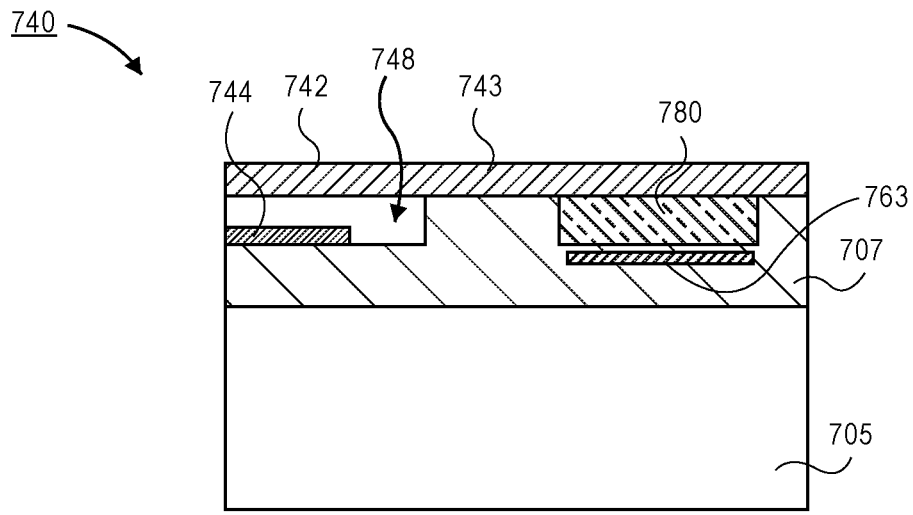
FIG. 7B is a cross-sectional illustration of a micro resonator sensor with a reflector ring with a heater for modulating a density and/or a modulus of the reflector ring, in accordance with an embodiment.

Referring now to FIG. 7B, a cross-sectional illustration of micro resonator sensor 740 with a tunable reflector ring 780 is shown, in accordance with an additional embodiment. In an embodiment, the reflector ring 780 is shown as being a block of material that is embedded in the device layer 707. In an embodiment, the reflective characteristics (i.e., impedance) of the block of material of the reflector ring 780 may be modulated by changing a density and/or a modulus of the material. In some embodiments, the density and/or the modulus may be modulated by locally changing the temperature of the reflector ring 780. For example, embodiments may include a heater 763. In some embodiments, the reflector ring 780 may comprise a phase changing material. Heating the phase changing material may result in a phase change that alters the impedance of the reflector ring 780. The heater 763 may be embedded in the device layer 707 below the reflector ring 780. The heater 763 may also be embedded in the capping layer 780 above the reflector ring 780.

Figure 7C:
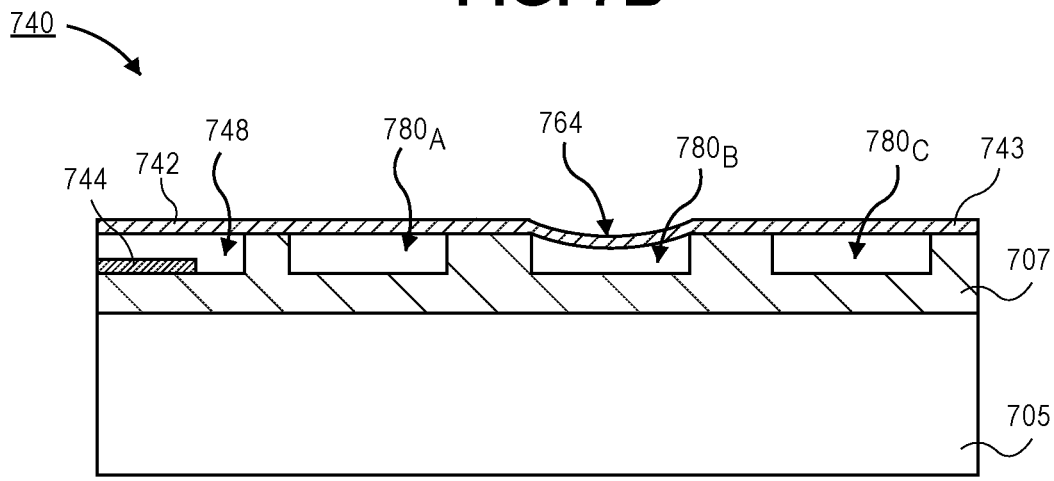
FIG. 7C is a cross-sectional illustration of a micro resonator sensor with a plurality of reflector rings that have actuatable capping layers over the cavities, in accordance with an embodiment.

Referring now to FIG. 7C, a cross-sectional illustration of a micro resonator sensor 740 with a plurality of reflector rings $780_{A-C}$ is shown, in accordance with an embodiment. In an embodiment, the reflector rings $780_{A-C}$ may have their reflective properties modulated by displacing a portion of the capping layer 743. For example, a portion 764 of the capping layer 743 is displaced down into the reflector ring 780 cavity. For example, the portion 764 of the capping layer 743 may be displaced using electrostatic forces. In FIG. 7C, the second reflector ring 780B is shown as being actuated, but embodiments include actuating any number of the reflector rings 780 in order to provide a desired reflection characteristic.

It is to be appreciated that each of the modulation schemes in FIGS. 7A-7C may be implemented in real time. That is, the reflector ring (or reflector rings) 780 may be modulate during the processing of the capping layer.

Figure 7D:
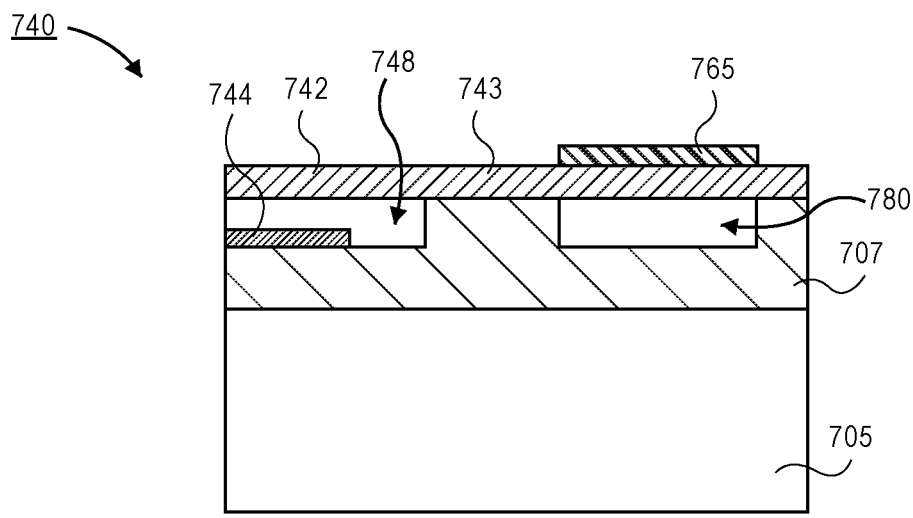
FIG. 7D is a cross-sectional illustration of a micro resonator sensor with a reflector ring that comprises a block over the reflector ring in order to modulate an impedance of the reflector, in accordance with an embodiment.

Referring now to FIG. 7D, a cross-sectional illustration of a micro resonator sensor 740 with a reflector block 765 over the reflector ring 780 is shown, in accordance with an embodiment. In an embodiment, the reflector block 765 may be deposited over the reflector ring 780 with any suitable deposition process. Adding the reflector block 765 locally changes the average density and/or modulus proximate to the reflector ring 780 in order to change the reflective characteristics (i.e., impedance) of the reflector ring 780. For example, the reflector block 765 may be a different material than the capping layer 765.

Figure 7E:
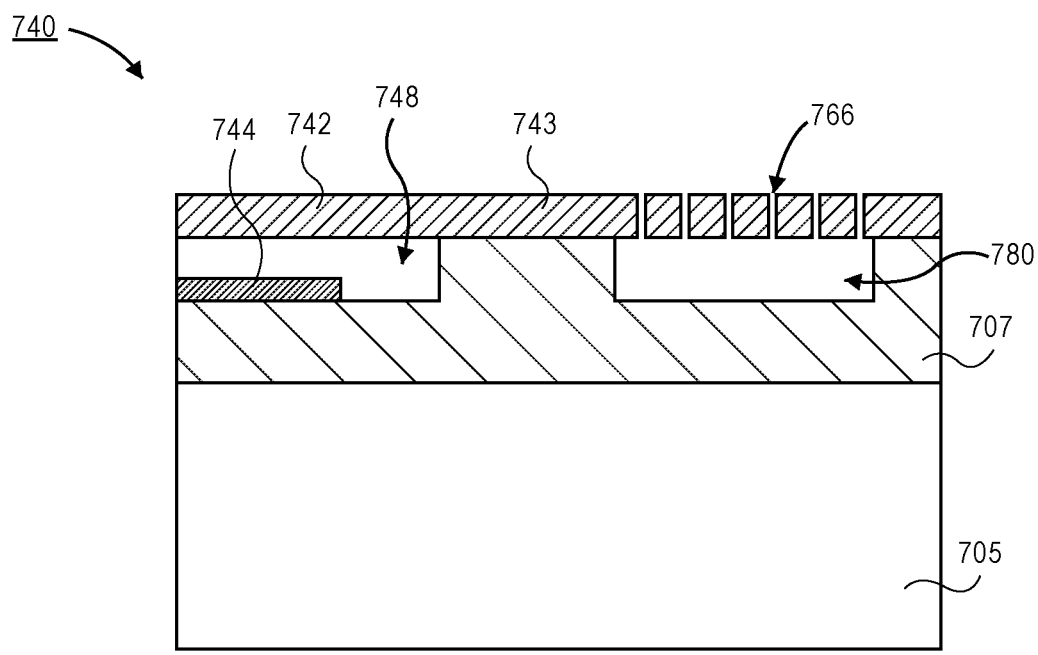
FIG. 7E is a cross-sectional illustration of a micro resonator sensor with a reflector ring that comprises a plurality of holes through the capping layer over the reflector ring, in accordance with an embodiment.

Referring now to FIG. 7E, a cross-sectional illustration of a micro resonator sensor 740 with a plurality of holes 766 through the capping layer 743 is shown, in accordance with an embodiment. The plurality of holes 766 changes the effective modulus and effective density of the capping layer 743 over the reflector ring 780 in order to change the reflective characteristics (i.e., impedance) of the reflector ring 780. The number and size of the holes may be changed to provide the desired reflective characteristic. In an embodiment, the holes 766 may be formed with a patterning and etching process.

Figure 8A:
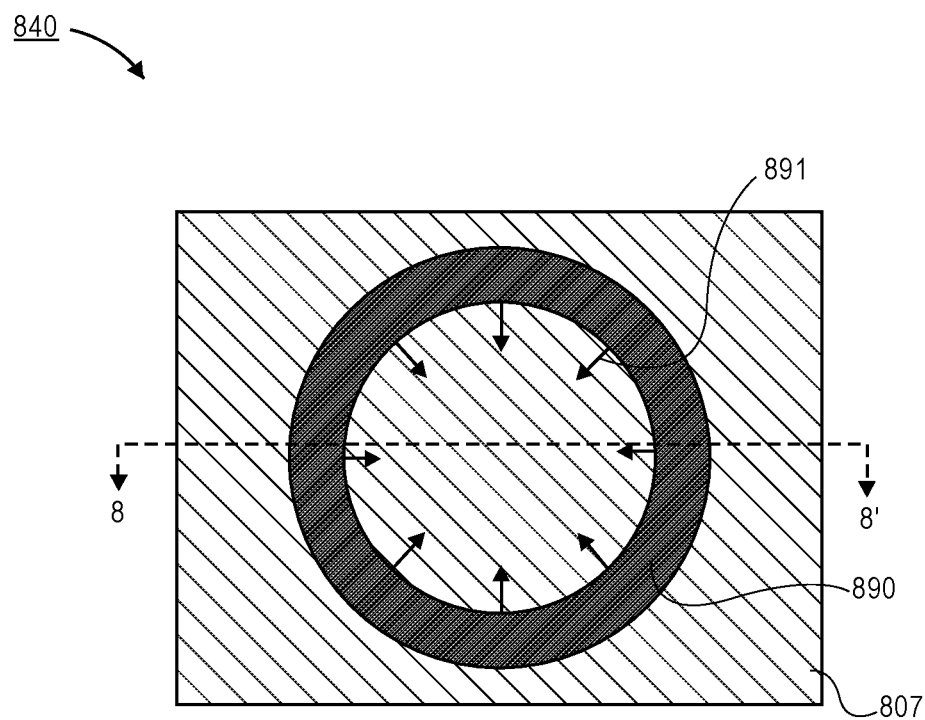
FIG. 8A is a plan view illustration of a resonator ring that surrounds a portion of the device layer and the capping layer, in accordance with an embodiment.

Referring now to FIG. 8A, a plan view illustration of a micro resonator sensor 840 is shown, in accordance with an additional embodiment. The micro resonator sensor 840 may include a ring resonator 890 that is formed into the device layer 807. The capping layer is omitted for clarity. The ring resonator 890 may be a circular ring or any other desired shape. The ring resonator 890 surrounds a portion of the device layer 807. The use of a ring resonator 890 allows for acoustic energy 891 propagating away from the inner surface of the ring resonator 890 to be confined in order to improve the quality factor.

Figure 8B:
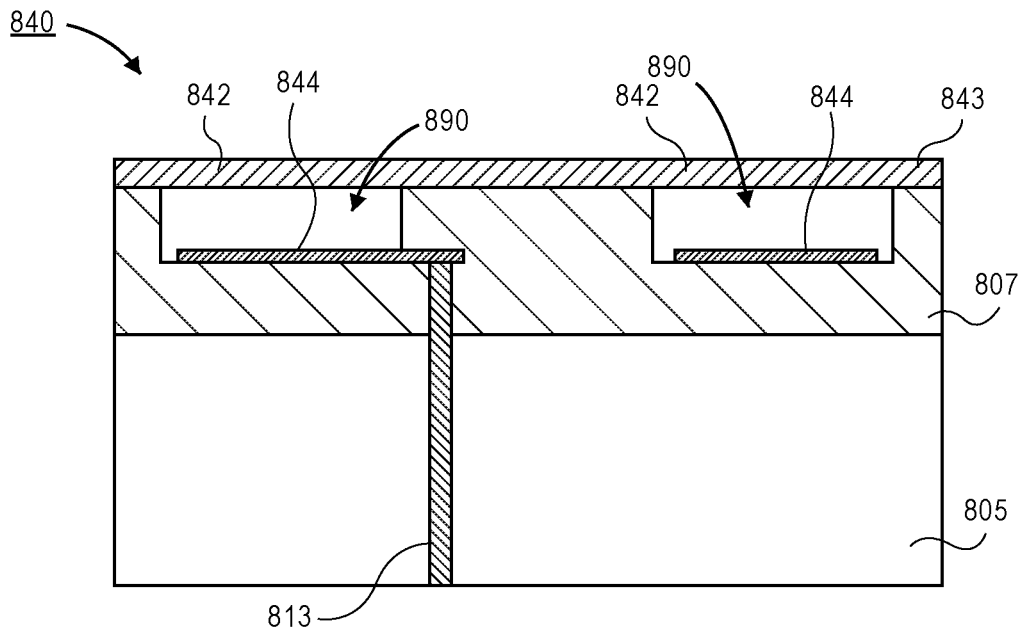
FIG. 8B is a cross-sectional illustration of the resonator ring in FIG. 8A along line 8-8', in accordance with an embodiment.

Referring now to FIG. 8B, a cross-sectional illustration of the micro resonator sensor 840 in FIG. 8A along line 8-8' is shown, in accordance with an embodiment. The micro resonator sensor 840 may comprise a substrate 805, a device layer 807 over the substrate 805, and a capping layer 843 over the device layer 807. The capping layer 843 may comprise a diaphragm 842 that spans across the ring resonator 890 and functions as the resonating body. In an embodiment, the ring resonator 890 may comprise drivers and sensors (e.g., electrodes 844) for driving and sensing resonance of the diaphragm 842. A via 813 or other interconnect may be electrically coupled to the electrodes 844 in some embodiments.

In the illustrated embodiment, the ring resonator 890 comprises a cavity that is formed into device layer 807. The cavity provides room for the diaphragm 842 to oscillate. Additionally, since the cavity of the ring resonator 890 has a different acoustic impedance than the device layer 807 and the capping layer 843, acoustic energy propagating away from the interior edge of the ring resonator is reflected back and is confined in order to provide an increased quality factor.

Figure 8C:
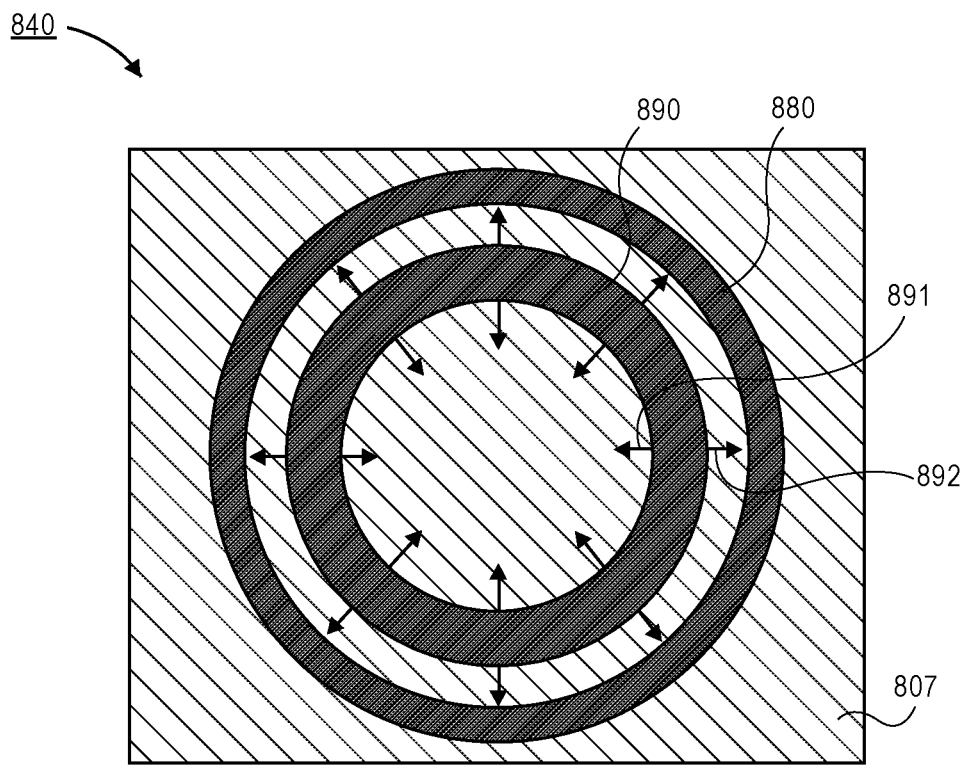
FIG. 8C is a plan view illustration of a resonator ring with a reflector around the resonator ring, in accordance with an embodiment.

Referring now to FIG. 8C, a plan view illustration of a micro resonator sensor 840 with a ring resonator 890 and a reflector ring 880 is shown, in accordance with an embodiment. Similar to the embodiment in FIG. 8A, the ring resonator 890 confines the acoustic energy 891 propagating away from an interior surface of the ring resonator 890. Additionally, the reflector ring 880 that surrounds the ring resonator 890 reflects and confines acoustic energy 892 propagating away from an exterior surface of the ring resonator 890. Accordingly, more of the acoustic energy is preserved (compared to the embodiment in FIG. 8A), and the quality factor is improved. The reflector ring 880 may be substantially similar to reflector rings in accordance with embodiments described above.

Figure 9:
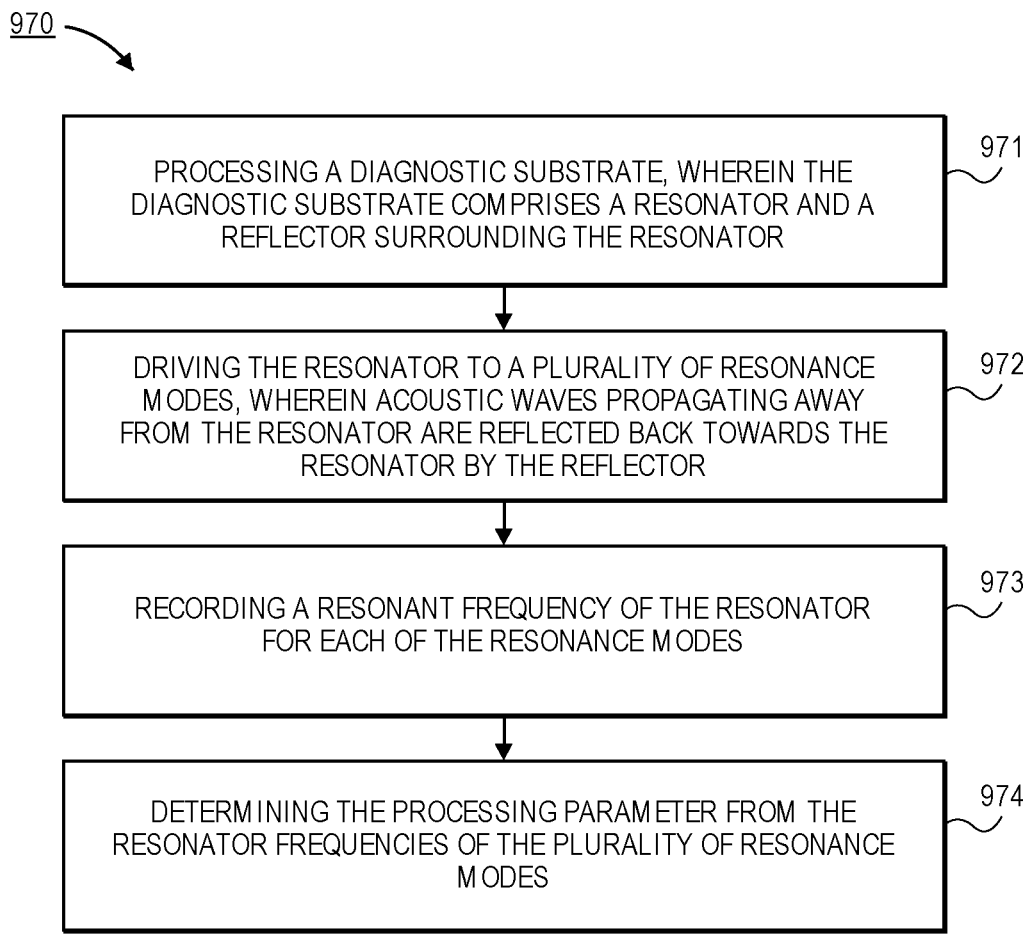
FIG. 9 is a process flow of a process for determining process parameters of a processing operation, in accordance with an embodiment.

Referring now to the flow diagram in FIG. 9, a method for determining a process parameter of a processing operation is shown and described, in accordance with an embodiment. In an embodiment, the process 970 may begin with operation 971 which includes processing a diagnostic substrate. In an embodiment, the diagnostic substrate may include one or more micro resonator sensors in accordance with embodiments such as those described above. For example, the micro resonator sensor may comprise a resonator and a reflector ring that surrounds the resonator. In an embodiment, the processing may include the processing of the capping layer. For example, a pattern may be etched into portions of the capping layer (e.g., over the diaphragm of the micro resonator sensor). However, it is to be appreciated that the processing operation may be any processing operation that is being investigated with the diagnostic substrate. For example, the processing operation may be an etching process, a deposition process, a polishing process, an implantation process, or any other process that alters the topography of the capping layer.

Referring now to operation 972, process 970 may continue with driving the resonator to a plurality of resonance modes by applying a drive signal to the micro resonator. For example, the drive signal may comprise a frequency sweep (also referred to as a "chirp"), a ping, or the like. The drive signal causes oscillation of the resonator. The oscillation of the resonator may be sensed by a sensing circuitry block. For example, the oscillation may result in an impedance change in the circuit (e.g., when a chirp is used), or the oscillations may simply be counted (e.g., when a ping is used). In an embodiment, the resonator may be driven to a plurality of resonance modes with electrodes in the micro resonator sensor. In a particular embodiment, the resonator may be driven to a first resonance mode, a second resonance mode, and a third resonance mode. In an embodiment, acoustic waves (e.g., surface acoustic waves and/or bulk acoustic waves) propagating away from the resonator may be reflected back towards the resonator by the reflector ring.

Referring now to operation 973, process 970 may continue with recording the resonance frequency of each of the plurality of resonance modes. In an embodiment, the resonance frequencies of each of the resonance modes may be recorded in a memory that is local to the diagnostic substrate. In an additional embodiment, the resonance frequencies may be transmitted to an external memory, (e.g., with a wireless communication module on the diagnostic substrate).

Referring now to operation 974, process 970 may continue with determining a process parameter from the plurality of resonance frequencies. In an embodiment, the process parameter may include an etch depth, a width of a trench, a profile of a trench wall, a thickness of a deposited layer, or any other change in the capping layer. The process parameter may be determined by using the plurality of resonance frequencies and models for the moments of inertia for each of the bending directions of the resonance modes, similar to the process described above with respect to FIG. 2C.

Embodiments may continue with adjusting a process recipe of the processing operation. For example, temperatures, pressures, gas flows, or the like may be changed. The ability to change the processing recipe in situ allows for greater refinement of the processing operation and provides more information about the processing operation.

Embodiments may also continue with determining if an endpoint is reached. For example, the endpoint may be a desired time, a desired process parameter, or any other desired criteria. When the endpoint is not reached, the process may continue with repeating the processing operations until the endpoint criteria is reached.

As noted above, the ability to determine the processing parameters in-situ allow for the rates of change of the processing parameter to be determined. Accordingly, greater detail about the processing operation under investigation may be obtained in comparison to the information obtained by performing metrology after the processing operation is completed.

Furthermore, it is to be appreciated that the process 970 may be implemented with a plurality of micro resonator sensors formed over the surface of the diagnostic substrate. For example, tens of thousands of micro resonator sensors in each of a plurality of sensing regions of the diagnostic substrate may be used in parallel to obtain uniformity information of the processing operation. In such embodiments, operation 974 may further include finding an average value of the processing parameter in each sensing region. The large quantity of micro resonator sensors in each sensing region allow for high precision and resolution due to the favorable signal to noise ratio obtained by processing the information obtained from each micro resonator.

In other embodiments, differential comparisons of resonance frequency of pairs of micro resonator sensors may be implemented. For example, differential comparisons may be used to determine temperatures, surface potentials, and/or pressures of the capping surface. Such differential comparisons may be implemented by using a pair of micro resonator sensors where one of the pair is used as a control to isolate one or more variables. For example, in the case of a surface potential, a bias may be applied to a first micro resonator and the second micro resonator sensor may be shorted (i.e., no bias is applied) to isolate the surface potential variable.

Figure 10:
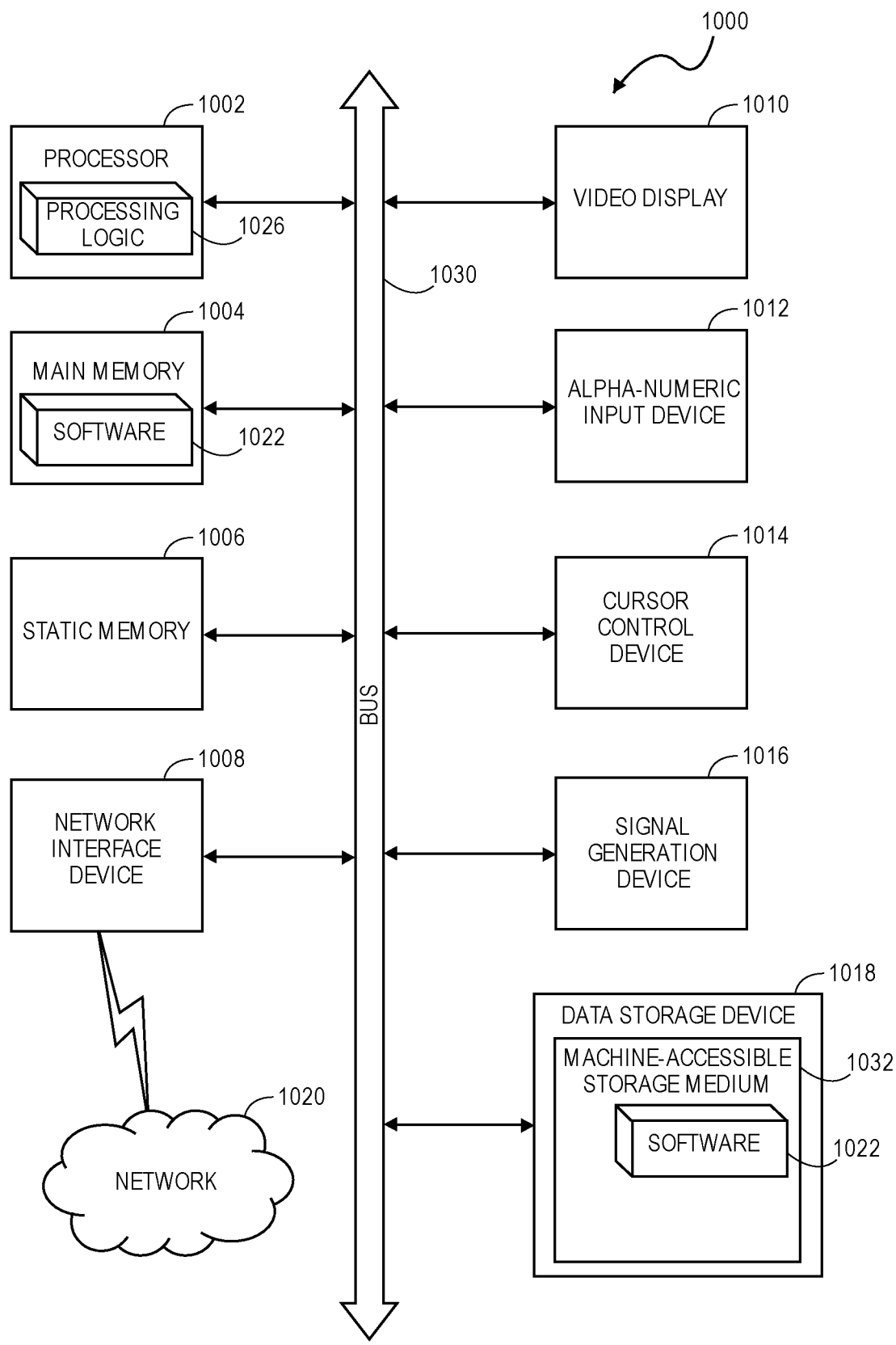
FIG. 10 illustrates a block diagram of an exemplary computer system that may be used in conjunction with processes for determining process parameters of a processing operation, in accordance with an embodiment.

Referring now to FIG. 10, a block diagram of an exemplary computer system 1060 of a processing tool is illustrated in accordance with an embodiment. In an embodiment, computer system 1060 is coupled to and controls processing in the processing tool. Computer system 1060 may be connected (e.g., networked) to other machines in a Local Area Network (LAN), an intranet, an extranet, or the Internet. Computer system 1060 may operate in the capacity of a server or a client machine in a client-server network environment, or as a peer machine in a peer-to-peer (or distributed) network environment. Computer system 1060 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1060, the term "machine" shall also be taken to include any collection of machines (e.g., computers) that individually or jointly execute a set (or multiple sets) of instructions to perform any one or more of the methodologies described herein.

Computer system 1060 may include a computer program product, or software 1022, having a non-transitory machine-readable medium having stored thereon instructions, which may be used to program computer system 1060 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1060 includes a system processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

System processor 1002 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1002 may also be one or more special-purpose processing devices such as an application specific integrated circuit (ASIC), a field programmable gate array (FPGA), a digital signal system processor (DSP), network system processor, or the like. System processor 1002 is configured to execute the processing logic 1026 for performing the operations described herein.

The computer system 1060 may further include a system network interface device 1008 for communicating with other devices or machines. The computer system 1060 may also include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium 1031 (or more specifically a computer-readable storage medium) on which is stored one or more sets of instructions (e.g., software 1022) embodying any one or more of the methodologies or functions described herein. The software 1022 may also reside, completely or at least partially, within the main memory 1004 and/or within the system processor 1002 during execution thereof by the computer system 1060, the main memory 1004 and the system processor 1002 also constituting machine-readable storage media. The software 1022 may further be transmitted or received over a network 1020 via the system network interface device 1008. In an embodiment, the network interface device 1008 may operate using RF coupling, optical coupling, acoustic coupling, or inductive coupling.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A diagnostic substrate, comprising:
   a substrate;
   a device layer over the substrate;
   a resonator in the device layer, wherein the resonator comprises:
      a cavity;
      a cover layer over the cavity; and electrodes within the cavity for driving and sensing resonance of the cover layer; and
   a reflector surrounding a perimeter of the resonator, wherein the reflector is configured to be modulated to reflect different frequencies, wherein modulating the reflector comprises changing a dimension of the cavity, wherein the dimension is changed by an actuator.

2. The diagnostic substrate of claim 1, wherein the reflector is a quarter-wavelength cavity reflector.

3. The diagnostic substrate of claim 1, wherein the reflector is embedded in the device layer.

4. The diagnostic substrate of claim 1, wherein a bottom surface of the cavity and a bottom surface of the reflector are at the same Z-height in the device layer.

5. The diagnostic substrate of claim 1, wherein the reflector is above a top surface of the device layer.

6. The diagnostic substrate of claim 1, wherein the reflector is below a bottom surface of the cavity.

7. The diagnostic substrate of claim 1, further comprising:
   a second reflector surrounding a perimeter of the reflector.

8. The diagnostic cavity of claim 1, wherein modulating the reflector comprises changing a density or a modulus of a material in the reflector.

9. The diagnostic cavity of claim 8, further comprising:
   a heater proximate to the reflector.

10. The diagnostic cavity of claim 1, wherein the reflector comprises a phase changing material.

11. A diagnostic substrate, comprising:
    a substrate;
    a device layer over the substrate, wherein the device layer has a first impedance;
    a ring having a second impedance, wherein the ring surrounds at least a portion of the device layer, wherein the ring is a cavity into the device layer;
    drivers and sensors configured to detect resonance; and
    a reflector surrounding the ring, wherein the reflector is configured to be modulated to reflect different frequencies, wherein modulating the reflector comprises changing a dimension of the cavity, wherein the dimension is changed by an actuator.

12. A method for determining a processing parameter, comprising:
    processing a diagnostic substrate, wherein the diagnostic substrate comprises a resonator and a reflector surrounding the resonator;
    driving the resonator to a plurality of resonance modes, wherein acoustic waves propagating away from the resonator are reflected back towards the resonator by the reflector; recording a resonant frequency of the resonator for each of the resonance modes; and
    determining the processing parameter from the resonant frequencies of the plurality of resonance modes.

13. The method of claim 12, wherein driving the resonator to a plurality of oscillation modes comprises applying a drive signal that is a chirp or a ping.

14. The method of claim 12, wherein the plurality of resonance modes comprises at least a first resonance mode and a second resonance mode, and wherein the first resonance mode is substantially parallel to a direction of a plurality of trenches over the resonator and the second resonance mode is substantially perpendicular to the plurality of trenches.

15. The method of claim 12, wherein the resonator is driven to a plurality of resonance modes in-situ in a chamber, in a load lock, in a mobile testing apparatus, or in a non-vacuum environment.

16. A diagnostic substrate, comprising:
    a substrate;
    a device layer over the substrate;
    a resonator in the device layer, wherein the resonator comprises:
       a cavity;
       a cover layer over the cavity; and electrodes within the cavity for driving and sensing resonance of the cover layer;
    a reflector surrounding a perimeter of the resonator, wherein the reflector is configured to be modulated to reflect different frequencies, wherein modulating the reflector comprises changing a density or a modulus of a material in the reflector; and
    a heater proximate to the reflector.

* * * * *